(12) United States Patent
Kim et al.

(10) Patent No.: US 11,903,222 B2
(45) Date of Patent: Feb. 13, 2024

(54) MEMORY DEVICE AND METHOD OF MANUFACTURING THE SAME

(71) Applicant: Samsung Electronics Co., Ltd., Suwon-si (KR)

(72) Inventors: Yumin Kim, Seoul (KR); Seyun Kim, Seoul (KR); Jinhong Kim, Seoul (KR); Soichiro Mizusaki, Suwon-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/185,817

(22) Filed: Mar. 17, 2023

(65) Prior Publication Data

US 2023/0225138 A1   Jul. 13, 2023

Related U.S. Application Data

(62) Division of application No. 17/317,154, filed on May 11, 2021, now Pat. No. 11,672,131.

(30) Foreign Application Priority Data

Sep. 4, 2020 (KR) .......................... 10-2020-0113196

(51) Int. Cl.
*H10B 63/00* (2023.01)
*H10N 70/00* (2023.01)
*H10N 70/20* (2023.01)

(52) U.S. Cl.
CPC ............ *H10B 63/84* (2023.02); *H10B 63/34* (2023.02); *H10N 70/011* (2023.02);
(Continued)

(58) Field of Classification Search
CPC ..................................................... H10B 63/34
See application file for complete search history.

(56) References Cited

U.S. PATENT DOCUMENTS

| 8,427,865 | B2 | 4/2013 | Shima et al. |
| 8,673,721 | B2 | 3/2014 | Toshiro et al. |
| (Continued) | | | |

FOREIGN PATENT DOCUMENTS

KR    10-2015-0070746 A    6/2015

OTHER PUBLICATIONS

Extended European Search Report dated Nov. 24, 2021, issued in corresponding European Patent Application No. 21178809.6.
(Continued)

*Primary Examiner* — Mounir S Amer
(74) *Attorney, Agent, or Firm* — Harness, Dickey & Pierce, P.L.C.

(57) ABSTRACT

A memory device may include an insulating structure including a first surface and a protrusion portion protruding from the first surface in a first direction, a recording material layer on the insulating structure and extending along a protruding surface of the protrusion portion to cover the protrusion portion and extending onto the first surface of the insulating structure, a channel layer on the recording material layer and extending along a surface of the recording material layer, a gate insulating layer on the channel layer; and a gate electrode formed on the gate insulating layer at a location facing a second surface of the insulating structure. The second surface of the insulating structure may be a protruding upper surface of the protrusion portion.

5 Claims, 37 Drawing Sheets

(52) U.S. Cl.
CPC ......... *H10N 70/231* (2023.02); *H10N 70/841* (2023.02); *H10N 70/8828* (2023.02); *H10N 70/8833* (2023.02)

(56) References Cited

U.S. PATENT DOCUMENTS

| | | |
|---|---|---|
| 9,059,395 B2 | 6/2015 | Ju et al. |
| 9,093,369 B2 | 7/2015 | Shin et al. |
| 9,246,096 B2 | 1/2016 | Hong et al. |
| 9,263,671 B1 | 2/2016 | Park |
| 9,490,429 B2 | 11/2016 | Sasago et al. |
| 9,947,685 B2 | 4/2018 | Fujii et al. |
| 9,947,686 B2 | 4/2018 | Son et al. |
| 9,953,997 B2 * | 4/2018 | Park ...................... H01L 23/528 |
| 9,978,938 B2 | 5/2018 | Trinh et al. |
| 2013/0200331 A1 | 8/2013 | Morikawa et al. |
| 2014/0145137 A1 | 5/2014 | Ju et al. |
| 2020/0266346 A1 | 8/2020 | Mo et al. |
| 2021/0035641 A1 | 2/2021 | Yoon et al. |
| 2021/0202833 A1 | 7/2021 | Kim et al. |
| 2021/0202840 A1 | 7/2021 | Kim et al. |
| 2021/0217473 A1 | 7/2021 | Cho et al. |
| 2022/0052259 A1 | 2/2022 | Kim et al. |
| 2022/0077235 A1 | 3/2022 | Kim et al. |

OTHER PUBLICATIONS

Notice of Allowance dated Feb. 2, 2023, issued in corresponding U.S. Appl. No. 17/317,154.

* cited by examiner

570

570

MEMORY DEVICE AND METHOD OF MANUFACTURING THE SAME

CROSS-REFERENCE TO RELATED APPLICATION

This application is a divisional of U.S. patent application Ser. No. 17/317,154, filed May 11, 2021, which is based on and claims priority under 35 U.S.C. § 119 to Korean Patent Application No. 10-2020-0113196, filed on Sep. 4, 2020 in the Korean Intellectual Property Office, the disclosure of each of which is incorporated by reference herein in its entirety.

BACKGROUND

1. Field

The present disclosure relates to a nonvolatile memory device and/or a method of manufacturing the same.

2. Description of Related Art

Semiconductor devices may be classified into memory devices and logic devices. A memory device may be configured to store data. Generally, semiconductor memory devices may be mainly classified into volatile memory devices and nonvolatile memory devices. When the supply of power to a volatile memory device is stopped, the volatile memory device may lose stored data. The volatile memory device may include, for example, dynamic random-access memory (DRAM), static random-access memory (SRAM), etc. A nonvolatile memory device may not lose stored data even if the supply of power thereto is stopped. The nonvolatile memory device may include, for example, programmable read-only memory (PROM), erasable PROM (EPROM), electrically EPROM (EEPROM), a flash memory device, etc.

Also, recently, along with high performance and low power consumption semiconductor memory devices, next-generation semiconductor memory devices, such as magnetic random-access memory (MRAM), phase-change random-access memory (PCRAM), resistive random-access memory (ReRAM), etc., have been developed. Materials included in these next-generation semiconductor memory devices may have resistance values varying according to a current, a voltage, or heat, and the resistance values may be retained even if the supply of current or voltage is stopped. These memory devices may be implemented as VNAND, and a permissible height in chip packaging has gradually approached a limit. Thus, a method of scaling a unit cell may have to be studied. A NAND flash product, which currently dominates the memory market, mainly includes a VNAND product, which provides benefits for improving the density. However, in the case of the VNAND product, a permissible height has almost reached a limit, and thus, there is a need to study a method of scaling a unit cell.

SUMMARY

Provided are a memory device having a structure with improved performance and density and/or a method of manufacturing the memory device.

Additional aspects will be set forth in part in the description which follows and, in part, will be apparent from the description, or may be learned by practice of the presented embodiments of the disclosure.

According to an embodiment, a memory device may include an insulating structure including a first surface and a protrusion portion protruding from the first surface in a first direction; a recording material layer on the insulating structure, the recording material layer extending along a protruding surface of the protrusion portion to cover the protrusion portion and extending onto the first surface of the insulating structure; a channel layer on the recording material layer and extending along a surface of the recording material layer; a gate insulating layer on the channel layer; and a gate electrode on the gate insulating layer at a location facing a second surface of the insulating structure. The second surface of the insulating structure may be a protruding upper surface of the protrusion portion.

In some embodiments, a length from the first surface to the second surface in the first direction may be greater than or equal to about 5 nm.

In some embodiments, the first surface and the second surface may be parallel with each other.

In some embodiments, the recording material layer may include a variable resistance material.

In some embodiments, the recording material layer may include any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$.

In some embodiments, the recording material layer may include a phase-change material.

In some embodiments, the recording material layer may include $Ge_2Sb_2Te_5$.

In some embodiments, a thickness of the recording material layer may be about 0.5 nm to about 30 nm.

In some embodiments, the memory device may further include a plurality of gate electrodes on the insulating structure. The insulating structure may include a plurality of protrusion portions spaced apart from each other in a second direction perpendicular to the first direction. The protrusion portion may be one of the plurality of protrusion portions. The gate electrode may be one of the plurality of gate electrodes. The plurality of gate electrodes may face the plurality of protrusion portions, respectively. The plurality of gate electrodes may be spaced apart from each other in the second direction.

In some embodiments, a length of the gate electrode in the second direction may be about 5 nm to about 30 nm.

In some embodiments, a distance between adjacent gate electrodes from among the plurality of gate electrodes may be about 5 nm to about 30 nm.

In some embodiments, the memory device may further include an isolating layer between adjacent gate electrodes among the plurality of gate electrodes.

In some embodiments, an area of the recording material layer may include a plurality of switching areas respectively facing the plurality of gate electrodes, each of the plurality of switching area may have both ends in the second direction, and the both ends of the plurality of switching areas each may contact the channel layer.

In some embodiments, an electrical distance between adjacent switching areas from among the plurality of switching areas may be greater than a physical distance between the adjacent switching areas.

In some embodiments, when a protrusion length of the protrusion portion is $D_p$, the electrical distance between the adjacent switching areas may be greater than the physical distance by $2D_p$.

In some embodiments, a length in the second direction of a corresponding switching area among the plurality of switching areas may be less than a length of the gate electrode in the second direction.

In some embodiments, the plurality of protrusion portions of the insulating structure may surround a cylindrical surface by a desired (and/or alternatively predetermined) width and may protrude in a radial direction. A longitudinal direction of the cylindrical surface corresponds to the second direction.

In some embodiments, the memory device may further include a common source line and a bit line. An end of the recording material layer and the channel layer in the second direction may be connected to the common source line and an other end of the recording material layer and the channel layer may be connected to the bit line, and the plurality of gate electrodes may be connected to a plurality of words lines, respectively.

According to an embodiment, an electronic device may include the memory device described above.

According to an embodiment, a method of manufacturing a memory device may include forming a stack structure by repeatedly and alternately depositing a sacrificial layer and an isolating layer on a substrate; forming a channel hole penetrating through the stack structure; removing a portion of the sacrificial layer such that an inner surface of the channel hole has a concavo-convex shape in a first direction perpendicular to a stack direction of the stack structure; sequentially forming a gate insulating layer, a channel layer, and a recording material layer on the inner surface of the channel hole; depositing an insulating material in the channel hole; forming a gate hole by removing all of a remaining portion of the sacrificial layer; and depositing an electrode material in the gate hole.

The method may further include removing an insulating material and a channel material deposited on a bottom surface of the channel hole. The removing the insulating material and the channel material may be performed after forming the gate insulating layer and the channel layer on the inner surface of the channel hole and before forming the recording material layer on the inner surface of the channel hole.

In some embodiments, a length of the concavo-convex shape in the first direction may be greater than or equal to about 5 nm.

In some embodiments, the forming the stack structure may include forming the sacrificial layer to have a thickness within a range of about 5 nm to about 30 nm.

In some embodiments, the forming the stack structure may include forming the isolating layer to have a thickness within a range of about 5 nm to about 30 nm.

According to an embodiment, a memory device may include an insulating structure including a first surface and a protrusion portion protruding from the first surface in a first direction; a gate insulating layer conformally covering the first surface and the protrusion portion of the insulating structure; a recording material layer extending between the gate insulating layer and both the first surface and the protrusion portion of the insulating structure; a channel layer extending between the recording material layer and both the first surface and the protrusion portion of the insulating structure; and a gate electrode on the gate insulating layer at a location facing a second surface of the insulating structure. The second surface of the insulating structure may be a surface of the protrusion portion that is spaced apart from the first surface of the insulating structure in the first direction.

In some embodiments, the recording material layer may include a variable resistance material.

In some embodiments, the recording material layer may include a phase-change material.

In some embodiments, a distance in the first direction between the first surface of the insulating structure and the second surface of the insulating structure may be about 1 nm to about 30 nm. A thickness of the recording material layer may be about 0.5 nm to about 30 nm.

In some embodiments, the memory device may further include a substrate and a plurality of gate electrodes on an upper surface of the substrate. The plurality of gate electrodes may be spaced apart from each other in a second direction. The second direction may be perpendicular to the first direction. The plurality of gate electrodes may include the gate electrode. The insulating structure may be on the upper surface of the substrate and may extend in the second direction through a channel hole defined in the plurality of gate electrodes. The insulating structure may include a plurality of protrusion portions spaced apart from each other in the second direction. The protrusion portion may be one of the plurality of protrusion portions. The gate electrode may be one of the plurality of gate electrodes. The recording material layer may extend in the second direction through the channel hole and may surround the insulating structure. The channel layer may extend in the second direction through the channel hole and may surround the recording material layer. The gate insulating layer may extend in the second direction through the channel hole and may surround the channel layer.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
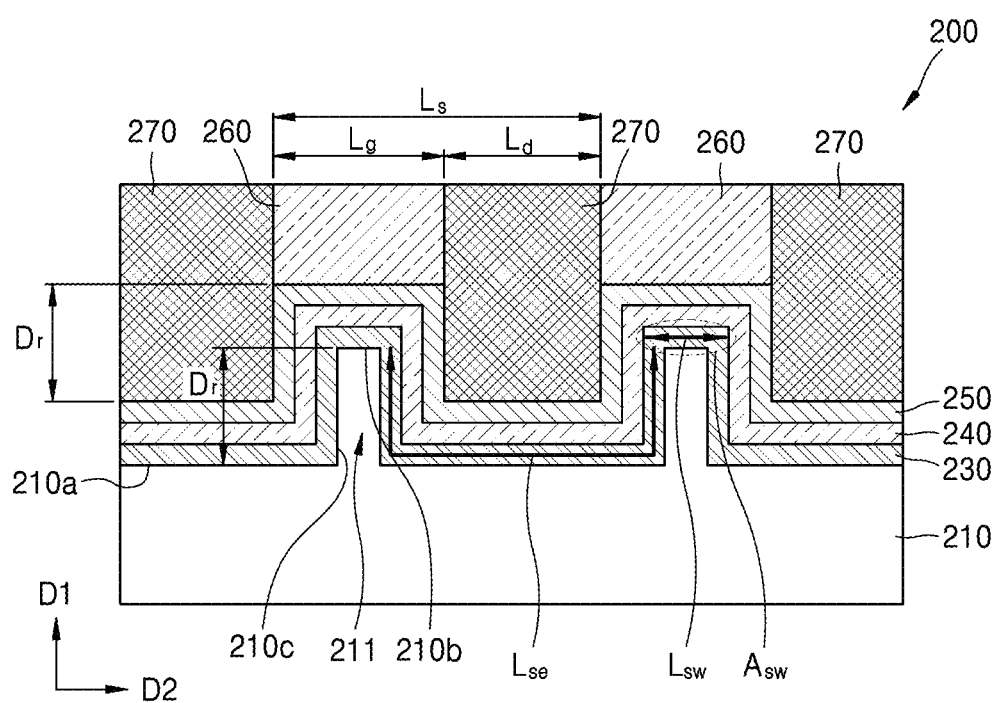
FIG. 1 is a schematic cross-sectional view of a memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described in detail by referring to the accompanying drawings. The embodiments described hereinafter are only examples, and various modifications may be made based on the embodiments. In the drawings, the same reference numerals denote the same elements and the sizes of elements may be exaggerated for clarity and convenience of explanation.

Hereinafter, it will be understood that when an element is referred to as being "on" or "above" another element, the element can be directly over or under the other element and directly on the left or on the right of the other element, or intervening elements may also be present therebetween.

Although the terms first, second, etc. may be used herein to describe various elements, these terms are only used to distinguish one element from another. These terms are not used to define differences of materials or structures between the elements.

As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

Also, the terms such as " . . . unit," "module," or the like used in the specification indicate an unit, which processes at least one function or motion, and the unit may be implemented by hardware or software, or by a combination of hardware and software.

The term "the" and other equivalent determiners may correspond to a singular referent or a plural referent.

Unless orders of operations included in a method are specifically described or there are contrary descriptions, the operations may be performed according to appropriate orders. The use of all example terms (e.g., etc.) are merely for describing the disclosure in detail and the disclosure is not limited to the examples and the example terms, unless they are not defined in the scope of the claims.

Figure 2:
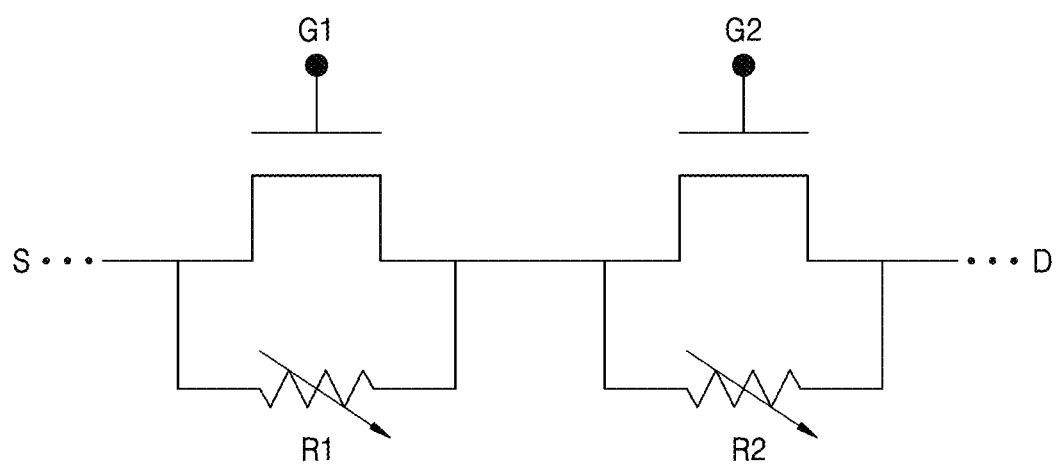
FIG. 2 is an equivalent circuit diagram of the memory device of FIG. 1.

FIG. 1 is a schematic cross-sectional view of a memory device 200 according to an embodiment, and FIG. 2 is an equivalent circuit diagram of the memory device 200 of FIG. 1.

Referring to FIG. 1, the memory device 200 may include: an insulating structure 210; a recording material layer 230, a channel layer 240, and a gate insulating layer 250, which are sequentially formed on the insulating structure 210; and a gate electrode 260 formed on the gate insulating layer 250.

The insulating structure 210 may have a protrusion portion 211 protruding from a first surface 210a in a first direction (a D1 direction) by a desired (and/or alternatively predetermined) distance. The recording material layer 230 and the channel layer 240 may be formed to be curved along a surface of the protrusion portion 211. This may be a configuration for deriving a stable switching operation in a switching area $A_{sw}$ in the recording material layer 230. This aspect will be described again with reference to FIGS. 3A through 3C.

The recording material layer 230 may be formed on the first surface 210a along the surface of the protrusion portion 211 to cover the protrusion portion 211. Also, the channel layer 240 may be formed along a surface of the recording material layer 230, and the gate insulating layer 250 may be formed on the channel layer 240.

The gate electrode 260 may be formed on the gate insulating layer 250 at a location facing a second surface 210b, which is a protruding upper surface of the protrusion portion 211. A length $L_g$ of the gate electrode 260 in a second direction (a D2 direction) may be within a range of about 5 nm to about 30 nm, but is not limited thereto.

The protrusion portion 211 may be provided in a multiple number in the second direction (the D2 direction) and the gate electrode 260 may also be provided in a multiple number to correspond to the plurality of protrusion portions 211. FIG. 1 illustrates two gate electrodes 260, as an example. One memory cell may be formed for each gate electrode 260. Thus, the number of gate electrodes 260 may be determined according to the number of memory cells that are desired.

The isolating layer 270 may be arranged between adjacent gate electrodes 260. A distance between the adjacent gate electrodes 260, that is, a length $L_d$ of the isolating layer 270 in the second direction (D2 direction), may be within a range of about 5 nm to about 30 nm, but is not limited thereto.

Due to a distance $D_r$ between the first surface 210a and the second surface 210b in the first direction (the D1 direction), the gate electrode 260 may be recessed from the isolating layer 270 by the distance $D_r$. As described above, the gate insulating layer 250, the channel layer 240, and the recording material layer 230 may be formed along a curved path of a recessed portion of the gate electrode 260.

An area of the recording material layer 230, the area facing the gate electrode 260, may correspond to the switching area $A_{sw}$, and each of both ends of the switching area $A_{sw}$ in the second direction (the D2 direction) may contact the channel layer 240. A length $L_{sw}$ of the switching area $A_{sw}$ in the second direction (the D2 direction) may be less than a length of the gate electrode 260 in the second direction (the D2 direction). Also, an electrical distance between adjacent switching areas $A_{sw}$ may be greater than a physical distance between the adjacent switching areas $A_{sw}$. As illustrated in FIG. 1, the electrical distance between the two adjacent switching areas $A_{SW}$ may be determined along a path of the recording material layer 230 and may be indicated as $L_{se}$. The physical distance between the two adjacent switching areas $A_{sw}$ may approximately correspond to a value of $L_{se}$-2$D_r$. In other words, the electrical distance between the adjacent switching areas $A_{sw}$ may be greater than the physical distance between the adjacent switching areas $A_{sw}$ by 2$D_r$. When the electrical distance between the adjacent switching areas $A_{sw}$ increases, interference between adjacent cells may be reduced.

According to the memory device 200 according to an embodiment, an electrical distance between adjacent cells is not limited to the distance $L_d$ between the gate electrodes 260. Rather, the electrical distance between the adjacent cells may be greater than the distance $L_d$ between the gate electrodes 260. Thus, a length $L_s$, which is a length of a basic cell, may be effectively reduced.

The distance $D_r$ may be set such that the switching area $A_{sw}$ described above may be formed, and the distance $D_r$ may be, for example, greater than or equal to about 5 nm, or greater than or equal to about 1 nm. An upper limit of the distance $D_r$ is not specifically limited and may be appropriately set according to a process condition. The distance $D_r$ may be set within a range of about 1 nm to about 30 nm, but is not limited thereto.

The first surface 210a, which is a flat surface of the isolating layer 270, and the second surface 210b, which is an upper surface of the protrusion portion 211, may be parallel with each other. However, the disclosure is not limited thereto. It is illustrated that a side surface 210c of the protrusion portion 211 is perpendicular to the first surface 210a. However, it is only an example. A shape of the protrusion portion 211 may be variously modified, when the shape allows the formation of the switching area $A_{sw}$ described above.

The recording material layer 230 may include a variable resistance material. Due to oxygen's behavior, occurring in the variable resistance material according to a voltage applied to the variable resistance material, an oxygen vacancy may be formed, and thus, a conductive filament may be formed. Depending on the formation of the conductive filament, the variable resistance material may indicate a low resistive state or a high resistive state, so as to write information of "1" or "0." The variable resistance material may include any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$. Also, the recording material layer 230 may implement a structure in which at least two of the described materials are included in a plurality of layers.

The recording material layer 230 may include a phase-change material. The phase-change material may indicate a high resistance in an amorphous state and a low resistance in a crystalline state. The phase-change as such may occur by Joule heating through an electrical pulse. According to the phase, information of "1" or "0" may be recorded. The phase-change material may include, for example, GST ($Ge_2Sb_2Te_5$). Also, various chalcogenide materials, such as $Ga_2Sb_2Te_5$, InSbTe, and GeSeTe, may be used as the phase-change material.

In the descriptions below, cases in which the recording material layer 230 includes the variable resistance material will be described as an example. However, the recording material layer 230 is not limited thereto.

A thickness of the recording material layer 230 may be within a range of about 0.5 nm to about 30 nm, but is not limited thereto.

The channel layer 240 may include a semiconductor material and may include, for example, poly-silicon. The channel layer 240 may be doped with a desired (and/or alternatively predetermined) dopant. The channel layer 240 may include, for example, materials, such as Ge, IGZO, GaAs, etc. A source electrode S and a drain electrode D as illustrated in FIG. 2 may be connected to both ends of the channel layer 240.

The gate insulating layer 250 may include various insulating materials, such as silicon oxide, silicon nitride, or silicon oxynitride.

Voltages for turning on/off the channel layer 240 may be selectively applied to the gate electrode 260.

The memory device 200 may have a structure in which a plurality of memory cells are arrayed. Also, as illustrated in the equivalent circuit diagram of FIG. 2, transistors and variable resistors may be connected in parallel with each other in the memory device 200. Each variable resistor may be set to a resistance (e.g., R1 and R2) according to a voltage applied to a gate electrode (e.g., G1 and G2) and voltage applied between the source electrode S and the drain electrode D, and may have a value corresponding to the data of 1 or 0.

Figure 3A:
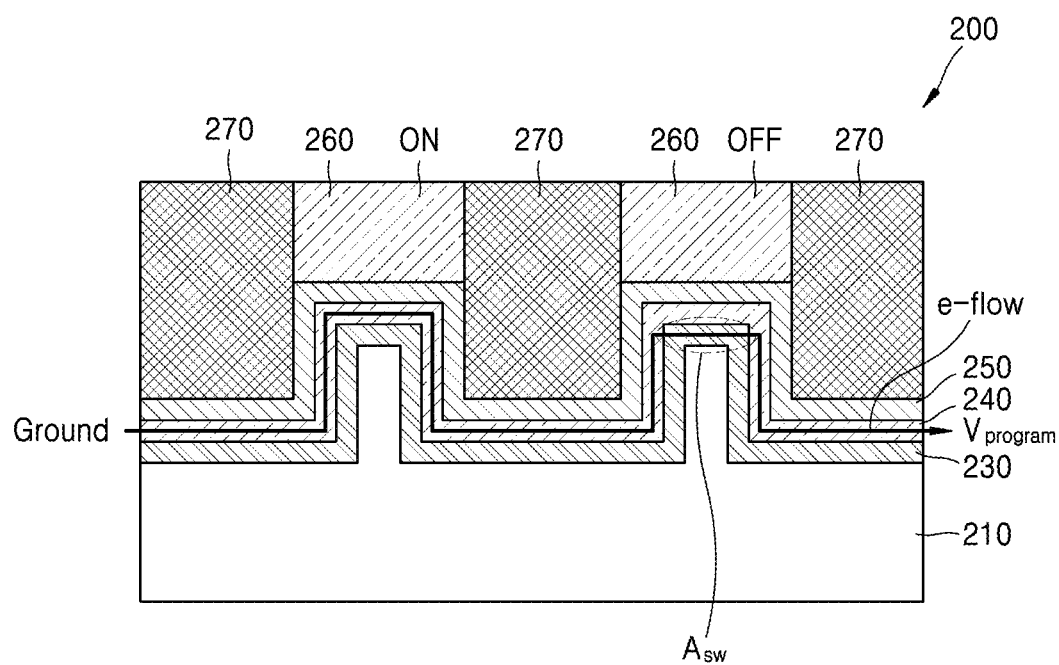
FIGS. 3A through 3C are cross-sectional views for describing writing, reading, and erasing operations of the memory device of FIG. 1.
Figure 3B:
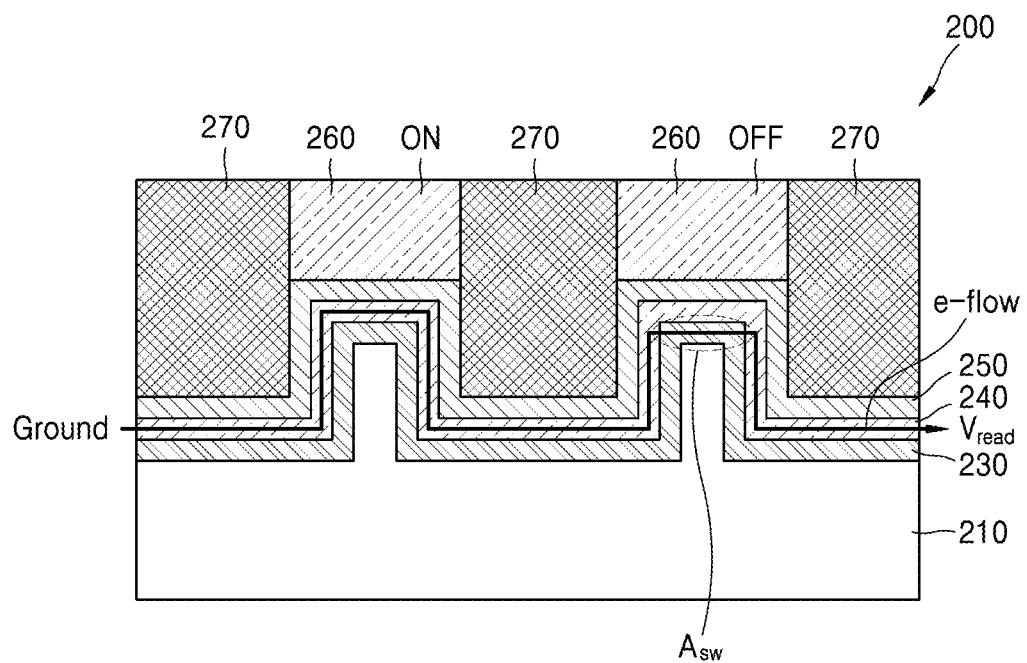
Figure 3C:
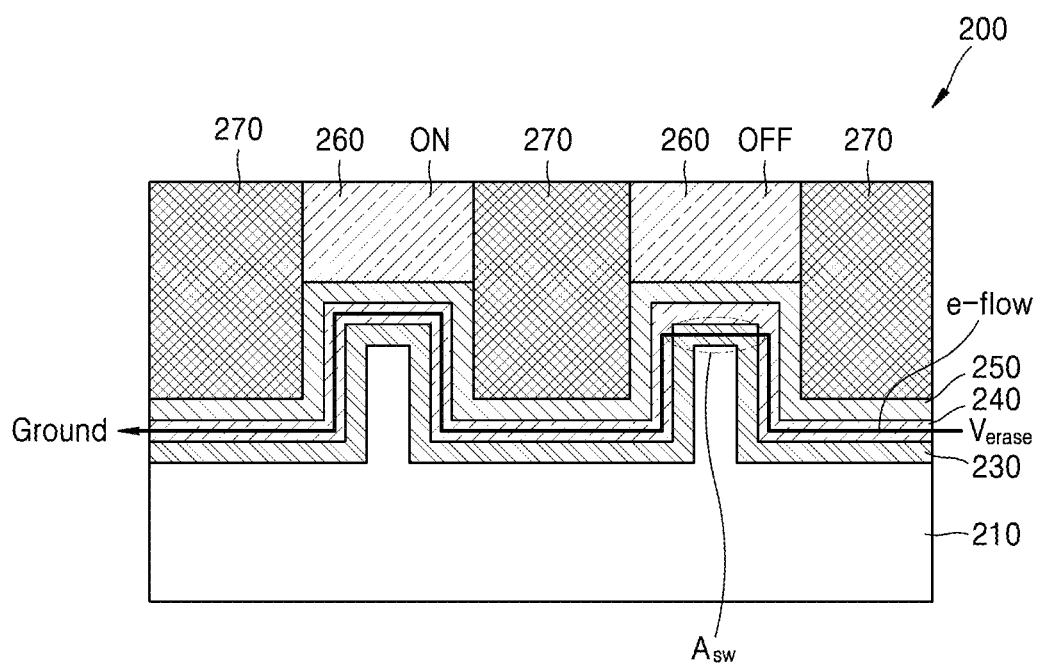

FIGS. 3A through 3C are cross-sectional views for describing writing, reading, and erasing operations of the memory device 200 of FIG. 1.

Referring to FIG. 3A, a left memory cell may not be selected as a writing cell, and a right memory cell may be selected as a writing cell. Accordingly, a channel-on gate voltage may be applied to the gate electrode 260 on the left side, and a channel-off gate voltage may be applied to the gate electrode 260 on the right side. When a write voltage Vprogram is applied to both ends of the channel layer 240, a current may flow through the channel layer 240 in the memory cell of the channel-on state (the left memory cell), and a current may not flow through the channel layer 240 in the memory cell of the channel-off state (the right memory cell) and the current may flow through the recording material layer 230. That is, a resistive state of a corresponding switching area $A_{sw}$ may be switched and information may be written.

Referring to FIG. 3B, the left memory cell may be a non-selected cell and a channel-on voltage may be applied to the gate electrode 260, and the right memory cell may be a selected cell and a channel-off voltage may be applied to the gate electrode 260. For a reading operation, a read voltage $V_{read}$ for not changing a resistive state of the switching area $A_{sw}$ may be applied to both ends of the channel layer 240. A current may not flow through the channel layer 240 and may flow through the recording material layer 230 in the right memory cell, which is in the channel-off state. The current may be measured to read a resistive state of the cell.

Referring to FIG. 3C, to erase the information written in the right memory cell, an erase voltage $V_{erase}$ may be applied for a current to flow in a direction that is opposite to the direction in which the current flows in the writing operation. The left memory cell may be the non-selected cell and a channel-on voltage may be applied to the gate electrode 260, and the right memory cell may be the selected cell and a channel-off voltage may be applied to the gate electrode 260. In the right memory cell of the channel-off state, the current may not flow through the channel layer 240 and may flow through the recording material layer 230 in the opposite direction to the writing operation, thereby switching the resistive state.

With respect to the switching area $A_{sw}$ of the selected cell in FIGS. 3A through 3C, the channel layer 240 may contact both ends of the switching area $A_{sw}$. Thus, a direction of the current flow passing the channel layer 240, the recording material layer 230, and the channel layer (240) may be constant. Therefore, a relatively more smooth cell-switching operation may be possible.

In FIGS. 3A-3C, a number of selected cell and a number of unselected cell are just example, the embodiment is not limited to the drawings and a number of selected cells may be variously changed.

Figure 4A:
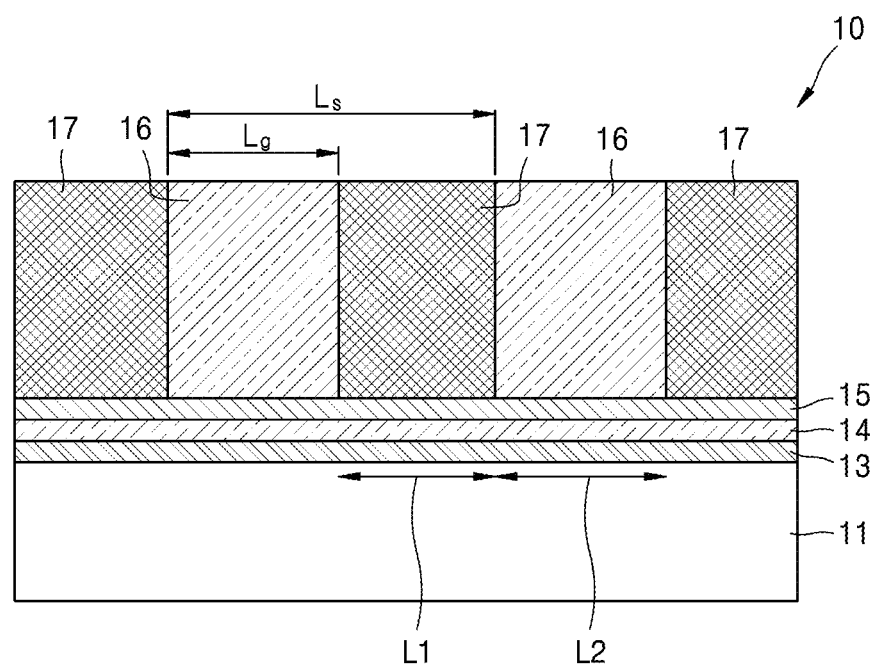
FIG. 4A is a schematic cross-sectional view of a memory device according to a comparative embodiment and FIG. 4B illustrates a current flow in the memory device of FIG. 4A.
Figure 4B:
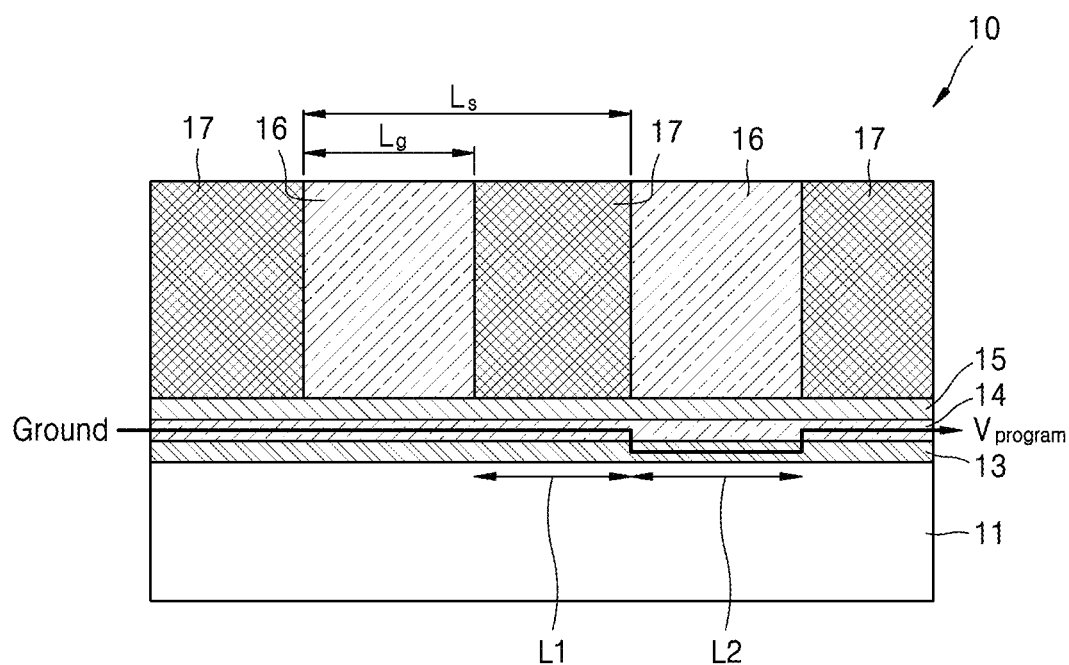

FIG. 4A is a schematic cross-sectional view of a memory device 10 according to a comparative embodiment. FIG. 4B illustrates a current flow during a writing operation of the memory device 10 of FIG. 4A.

The memory device 10 may have a structure in which a recording material layer 13, a channel layer 14, a gate insulating layer 15, and a plurality of gate electrodes 16 are sequentially formed on a flat insulating structure 11.

FIG. 4B illustrates a case in which the gate electrode 16 on the right side is in an off state and a right memory cell is selected. With respect to a current path by the write voltage $V_{program}$, a current may not flow through the channel layer 14 in the right memory cell, and the current path is bent toward the recording material layer 13 from the channel layer 14. This current path change may negatively affect a stable switching operation.

Also, in this structure, a distance L1 between adjacent cells may correspond to a distance $L_d$ between adjacent gate electrodes 16, and a length L2 of a switching area may correspond to a length $L_g$ of the gate electrode 16. In the memory device 10 according to the comparative embodiment, the distance L1 between the adjacent cells may correspond to both an electrical distance and a physical distance.

On the contrary, in the case of the embodiment of FIG. 1, even when the length $L_g$ of the gate electrode 260 and the distance $L_d$ between the gate electrodes 260 are the same as the case of the memory device 10 according to the comparative embodiment, the electrical distance $L_{se}$ between the adjacent cells may be greater than the electrical distance L1 between the adjacent cells according to the comparative embodiment, and the distance $L_{sw}$ of the switching area $A_{sw}$ may be less than the length L2 of the switching area according to the comparative embodiment. This may be based on the configuration of an embodiment that the electrical distance $L_{se}$ between the adjacent cells may be greater than the physical distance between the adjacent cells. In other words, in the memory device 200 according to an embodiment, the electrical distance $L_{se}$ between the adjacent cells may not correspond to the distance $L_d$ between the gate electrodes 260 and may be greater than the distance $L_d$. Also, the length $L_{sw}$ of the switching area $A_{sw}$ may not correspond to the length $L_g$ of the gate electrode 260 and may be greater than the length $L_g$.

In the case of the above description, the electrical distance between the adjacent cells according to an embodiment and the electrical distance between the adjacent cells according to the comparative embodiment are compared with each other, when the length $L_g$ of the gate electrode 260 of the memory device 200 according to an embodiment and the length Lg of the gate electrode 16 of the memory device 10 according to the comparative embodiment are the same as each other, and the length Ls of the basic cell according to an embodiment and the length Ls of the basic cell according to the comparative embodiment are the same as each other. Based on the comparison, it may be identified that, when the electrical distances are the same between the memory device 200 according to an embodiment and the memory device 10 according to the comparative embodiment, the memory device 200 according to an embodiment may have the largely decreased basic length Ls of the unit cell.

Figure 5A:
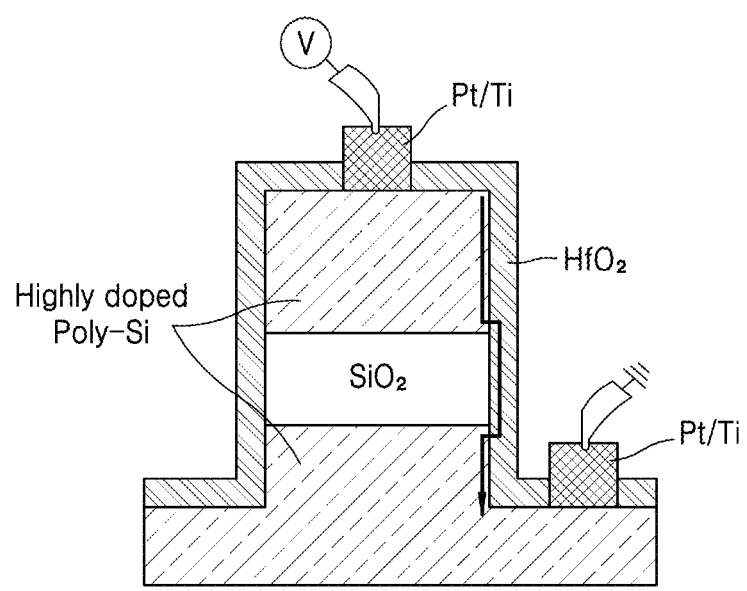
FIGS. 5A and 5B are schematic cross-sectional views of samples manufactured to compare a structure according to a comparative embodiment with a structure according to an embodiment.
Figure 5B:
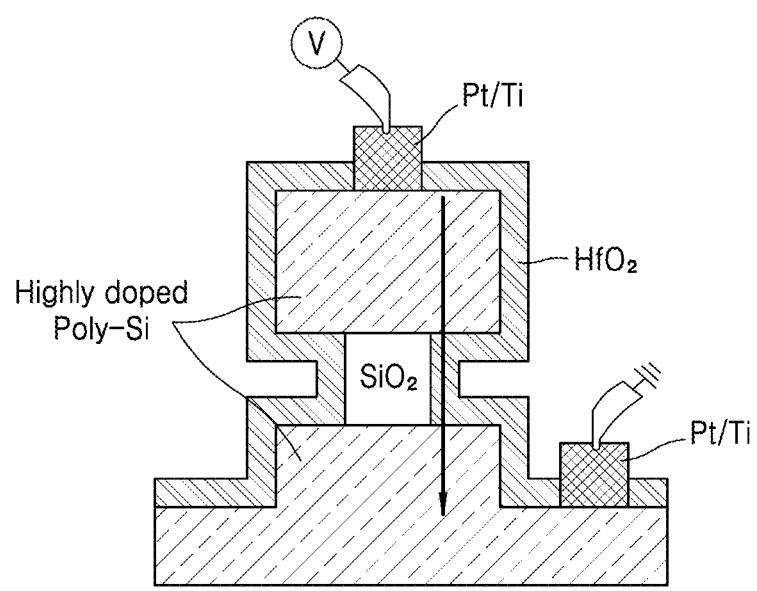

FIGS. 5A and 5B are schematic cross-sectional views of samples manufactured to compare structures according to a comparative embodiment and an embodiment.

FIG. 5A illustrates a structure in which a $SiO_2$ layer is formed between a highly doped polysilicon layer and a variable resistance material, $HfO_2$, is formed on lateral sides of the $SiO_2$ layer and the highly doped polysilicon layer. When a voltage is applied to upper and lower electrodes Pt/Ti, a current may flow in a path indicated by arrows, and this may correspond to a current path in a selected channel in the memory device 10 according to the comparative embodiment.

FIG. 5B illustrates a structure in which a $SiO_2$ layer is formed to be recessed between a highly doped polysilicon layer and a variable resistance material, $HfO_2$, is formed on lateral sides of the $SiO_2$ layer and the highly doped polysilicon layer. When a voltage is applied to upper and lower electrodes Pt/Ti, a current may flow in a path indicated by arrows, and this may correspond to a current path in a selected channel in the memory device 200 according to an embodiment.

Figure 6A:
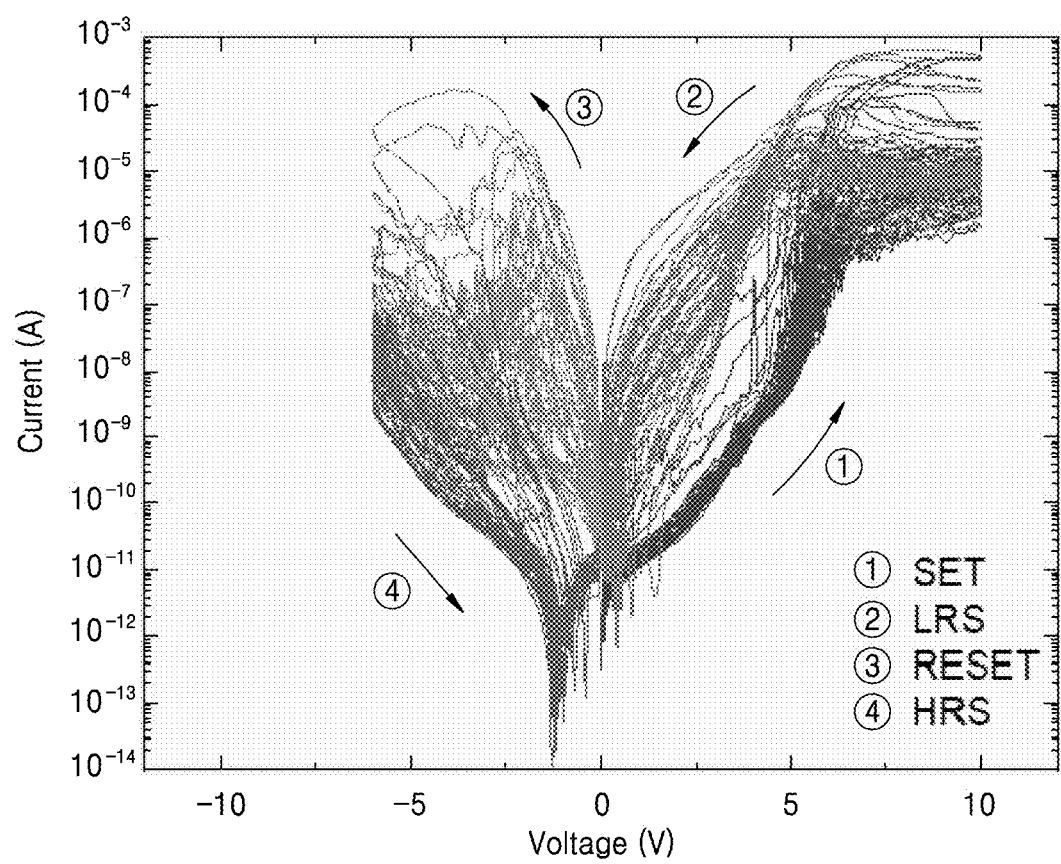
FIGS. 6A and 6B illustrate a I-V curve with respect to each of the samples of FIGS. 5A and 5B.
Figure 6B:
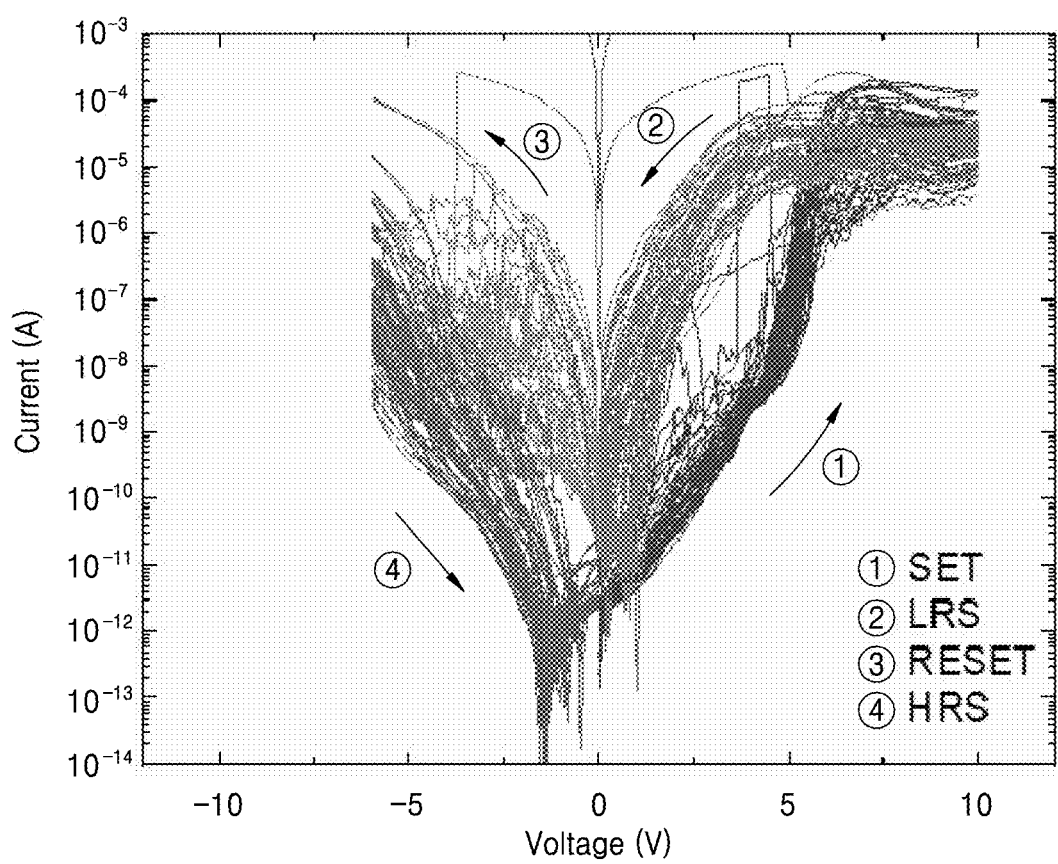

FIGS. 6A and 6B illustrate I-V curves with respect to the samples of FIGS. 5A and 5B, respectively.

FIGS. 6A and 6B illustrates 64 samples corresponding to FIGS. 5A and 5B, respectively.

The I-V curve shows that when a voltage is changed from 0V to 8V (① SET), a resistive state of the variable resistance material may be changed from an high resistance state (HRS) to a low resistance state (LRS), and when the voltage is again decreased from 8V to 0V (② LRS) and then is changed from 0V to −6V (③ RESET), the resistive state of the variable resistance material may be changed from the LRS to the HRS. Next, with an operation (④ HRS) of changing the voltage from −6V to 0V, a cycle may be completed.

To identify a resistance change, a resistance of the variable resistance material may be read at the voltage of 4V. Here, when a current value at the voltage of 4V in the second operation (②) corresponding to the LRS state is 1000 times a current value at the voltage of 4V in the first operation (①) corresponding to the HRS state, it may be determined that the sample may be used as a resistance change device.

From the comparison between the I-V curves with respect to the samples of FIGS. 5A and 5B, a yield rate having the above current ratio of 1000:1 or higher may be 50% in FIG. 6A, and may be much greater as 91% in FIG. 6B.

This may be a result of a more stable switching behavior in the case of FIG. 5B, because the current path through poly-Si/HfO2/poly-Si may be linear in the sample of FIG. 5B, while the current path through poly-Si/HfO2/poly-Si is curved.

Based on this result, in the case of the memory device 200 according to an embodiment, a stable switching behavior in the current path through the channel layer 240, the recording material layer 230, and the channel layer 240 in the switching area $A_{sw}$ may be expected and the performance distribution in manufactured products may be improved.

Figure 7:
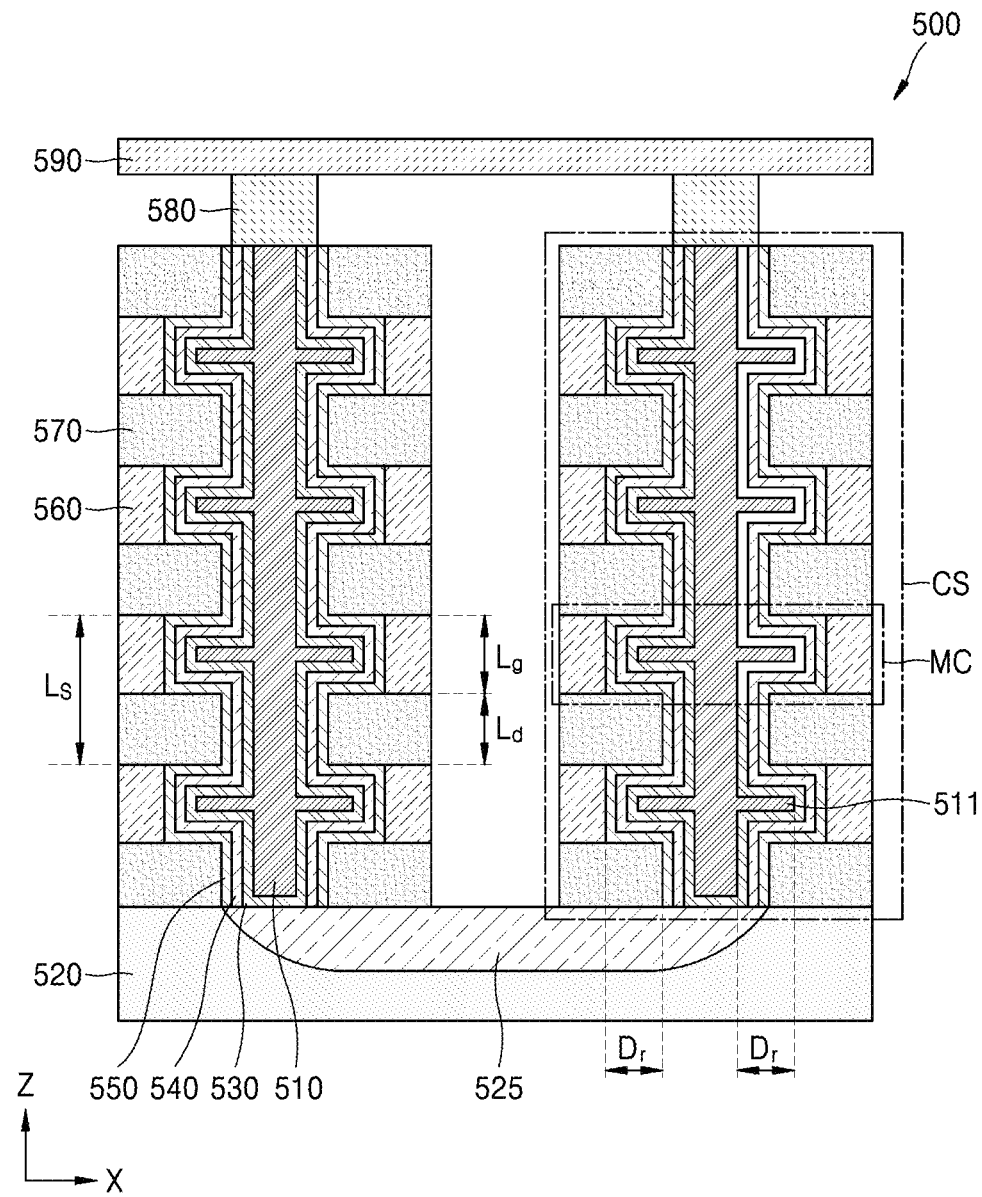
FIG. 7 is a schematic cross-sectional view of a memory device according to another embodiment.
Figure 8:
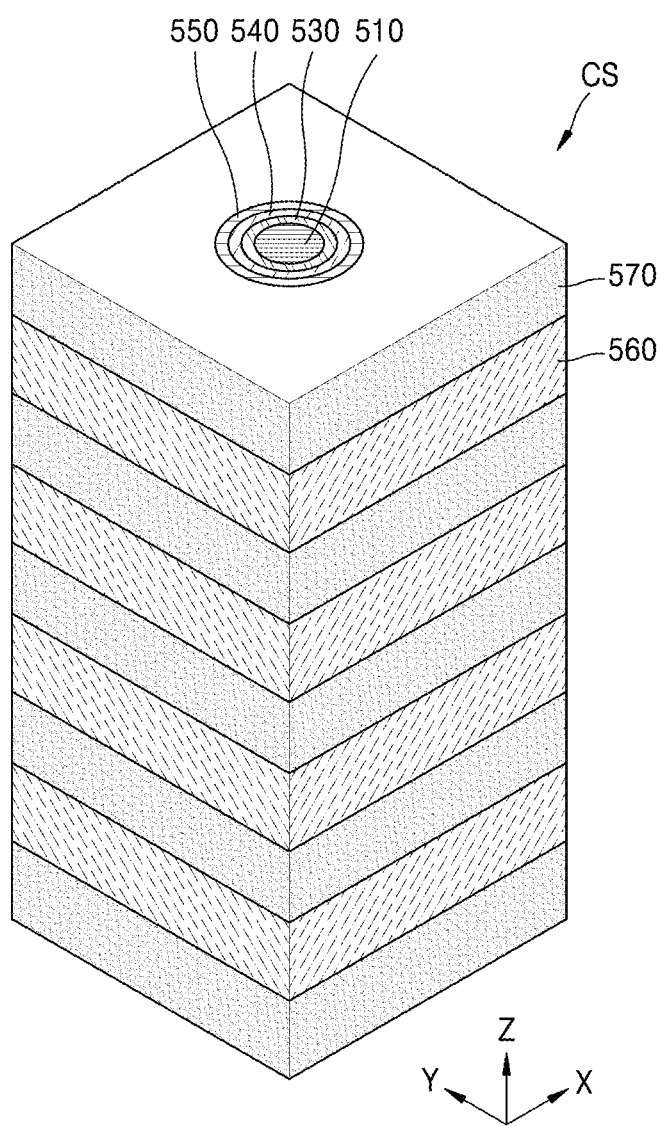
FIG. 8 is a schematic perspective view of a memory string included in the memory device of FIG. 7.
Figure 9:
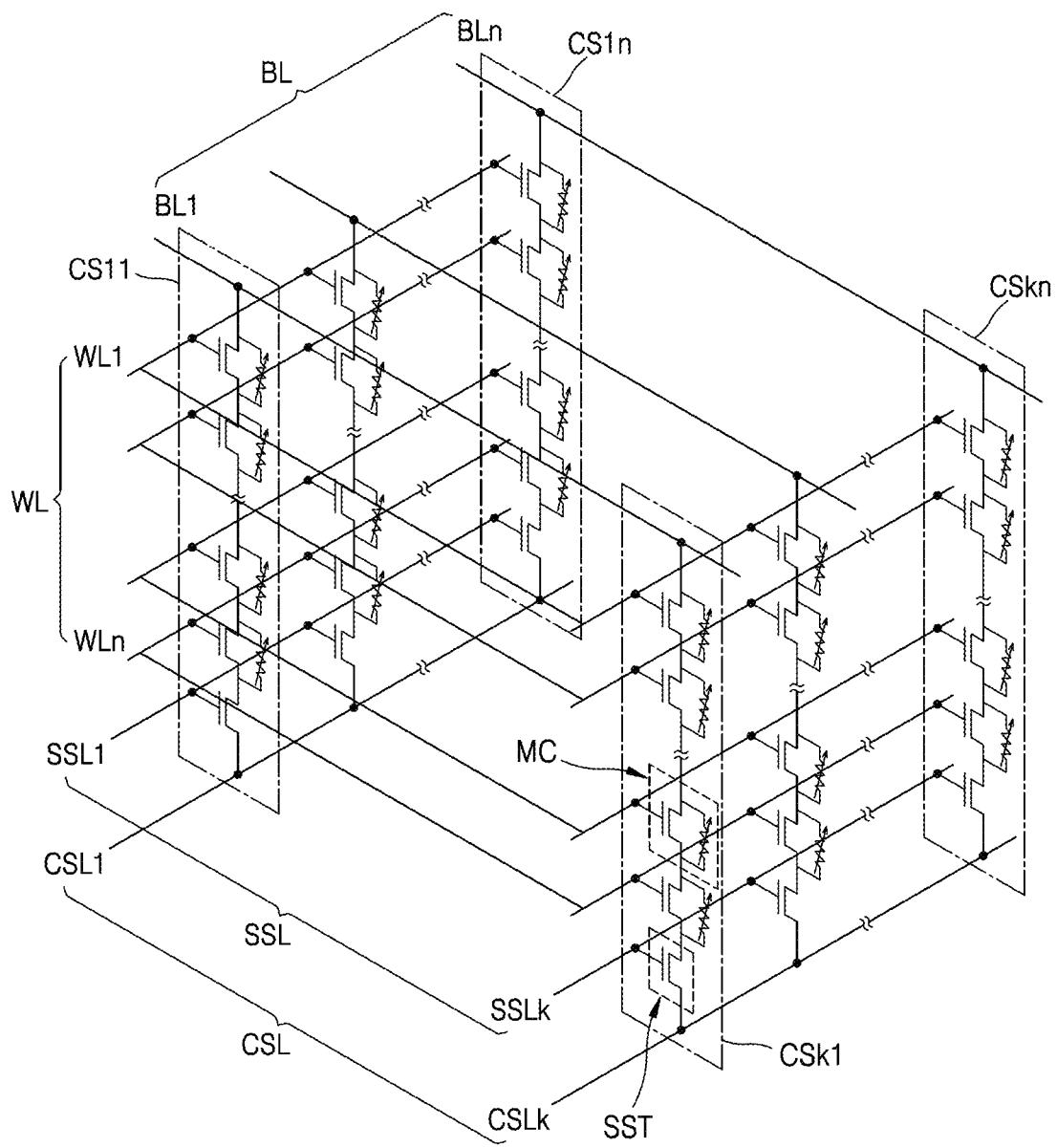
FIG. 9 is an equivalent circuit diagram of the memory device of FIG. 7.

FIG. 7 is a schematic cross-sectional view of a memory device 500 according to another embodiment, and FIG. 8 is a schematic perspective view of a memory string included in the memory device 500 of FIG. 7. FIG. 9 is an equivalent circuit diagram of the memory device 500 of FIG. 7.

The memory device 500 according to the present embodiment may correspond to a vertical NAND (VNAND) memory in which a plurality of memory cells MC are arrayed in a vertical direction. The memory device 500 may include a Pc-VNAND memory using a phase-change material or a Re-VNAND memory using a variable resistance material.

Detailed configurations of the memory device 500 will be described below with reference to FIGS. 7 through 9 together.

First, referring to FIG. 7, a plurality of cell strings CS may be formed on a substrate 520.

The substrate 520 may include a silicon material doped with a first-type impurity. For example, the substrate 520 may include a silicon material doped with a p-type impurity. For example, the substrate 520 may include a p-type well (for example, a pocket p well). Hereinafter, it is assumed that the substrate 520 includes p-type silicon. However, the substrate 520 is not limited to p-type silicon.

A doped area 525, which is a source area, may be provided on the substrate 520. The doped area 525 may include an n-type area, which is different from the substrate 520. Hereinafter, it is assumed that the doped area 525 includes an n-type area. However, the doped area 525 is not limited to the n-type area. The doped area 525 may be connected to a common source line CSL.

k*n cell strings CS may be provided as indicated in the circuit diagram of FIG. 9 and may be arranged in the matrix form. The cell strings CS may be referred to as CSij (1≤i≤k, 1≤j≤n) according to a location of a column and a row. Each cell string CSij may be connected to a bit line BL, a string selection line SSL, a word line WL, and the common source line CSL.

Each cell string CSij may include the memory cells MC and a string selection transistor SST. The memory cells MC and the string selection transistor SST of each cell string CSij may be stacked in a height direction.

Rows of the plurality of cell strings CS may be connected to different string selection lines SSL1 through SSLk, respectively. For example, the string selection transistors SST of the cell strings CS11 through CS1n may be commonly connected to the string selection line SSL1. The string selection transistors SST of the cell strings CSk1 through CSkn may be commonly connected to the string selection line SSLk.

Columns of the plurality of cell strings CS may be connected to different bit lines BL1 through BLn, respectively. For example, the memory cells and the string selection transistors SST of the cell strings CS11 through CSk1 may be commonly connected to the bit line BL1, and the memory cells MC and the string selection transistors SST of the cell strings CS1n through CSkn may be commonly connected to the bit line BLn.

Rows of the plurality of cell strings CS may be connected to different common source lines CSL1 through CSLk, respectively. For example, the string selection transistors SST of the cell strings CS11 through CS1n may be commonly connected to the common source line CSL1, and the string selection transistors SST of the cell strings CSk1 through CSkn may be commonly connected to the common source line CSLk.

Gate electrodes of the memory cells MC located in the same height from the substrate 520 or the string selection transistors SST may be commonly connected to one word line WL. Also, gate electrodes of the memory cells MC located in different heights from the substrate 520 or the string selection transistors SST may be connected to different word lines WL1 through WLm, respectively.

The illustrated circuit structure is an example. For example, the number of rows of the cell strings CS may increase or decrease. When the number of rows of the cell strings CS is changed, the number of string selection lines connected to the rows of the cell strings CS and the number of cell strings CS connected to one bit line may also be changed. When the number of rows of the cell strings CS is changed, the number of common source lines connected to the rows of the cell strings CS may also be changed.

The number of columns of the cell strings CS may also increase or decrease. When the number of columns of the cell strings CS is changed, the number of bit lines connected to the columns of the cell strings CS and the number of cell strings CS connected to one string selection line may also be changed.

Heights of the cell strings CS may also increase or decrease. For example, the number of memory cells MC stacked in each of the cell strings CS may increase or decrease. When the number of memory cells MC stacked in each cell string CS is changed, the number of word lines WL may also be changed. For example, the number of string selection transistors included in each cell string CS may increase. When the number of string selection transistors included in each cell string CS is changed, the number of string selection lines or the common source lines may also be changed. When the number of string selection transistors increases, the string selection transistors may be stacked in the same form as the memory cells MC.

For example, a writing operation and a reading operation may be performed for each row of the cell strings CS. The cell strings CS may be selected for each row by the common source line CSL, and the cell strings CS may be selected for each row by the string selection lines SSL. Also, a voltage may be applied to the common source lines CSL by a unit of at least two common source lines. A voltage may be applied to the common source lines CSL by a unit of the entire common source lines CSL.

The writing operation and the reading operation may be performed for each page in a selected row of the cell strings CS. A page may correspond to one row of the memory cells connected to one word line WL. The memory cells may be selected for each page by the word lines WLs, in a selected row of the cell strings CSs.

The cell strings CS may have a structure in which a plurality of gate electrodes 560 and a plurality of isolating layers 570 alternately surround a structure including an insulating structure 510, a recording material layer 530, a channel layer 540, and a gate insulating layer 550, as illustrated in FIGS. 7 and 8. The cell strings CS are illustrated as a square pillar shape. However, it is an example, and the cell strings CS are not limited thereto. For example, the cell strings CS may be formed as a cylindrical shape.

A shape of the structure including the insulating structure 510, the recording material layer 530, the channel layer 540, and the gate insulating layer 550 will be described.

First, the insulating structure 510 may have a shape in which the insulating structure 510 includes a plurality of protrusion portions 511, the plurality of protrusion portions 511 protruding in a radius direction and surrounding a cylindrical surface by a certain width, the cylindrical surface having a Z direction as a longitudinal direction. A length $D_r$ in which the protrusion portions 511 protrude in the radius direction (an X direction in FIG. 7) may be greater than or equal to about 5 nm. The length $D_r$ may be within a range of about 1 nm to about 30 nm.

The recording material layer 530 may surround a surface of the insulating structure 510 by a certain width. The recording material layer 530 may include a variable resistance material or a phase-change material. The variable resistance material may include any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2P_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$. The phase-change material may include GST ($Ge2Sb2Te5$).

The channel layer 540 may surround a surface of the recording material layer 530 by a certain width. The channel layer 540 may include a semiconductor material doped with a first-type material. The channel layer 540 may include a silicon material doped with a material of the same-type as the substrate 520. For example, when the substrate 520 includes a p-type doped silicon material, the channel layer 540 may also include a p-type doped silicon material. Alternatively, the channel layer 540 may include materials, such as Ge, IGZO, GaAs, etc.

The gate insulating layer 550 may surround a surface of the channel layer 540 by a certain thickness. The gate insulating layer 550 may include various insulating materials, such as silicon oxide, silicon nitride, or silicon oxynitride.

The shape of the structure including the insulating structure 510, the recording material layer 530, the channel layer 540, and the gate insulating layer 550 may, similarly to the shape of the insulating structure 510 arranged at the inner most region, correspond to a shape in which a plurality of structures protruding in the radius direction are formed on a cylindrical surface.

The gate electrode 560 may surround a protruding portion of an external surface of the inner structure, and the isolating layer 570 may surround a recessed portion of the external surface of the inner structure. The isolating layer 570 may be configured to isolate between the plurality of gate electrodes 560. The gate electrodes 560 and the plurality of isolating layers 570 may be alternately stacked in a vertical direction (a Z direction).

A length of the gate electrode 560 in the Z direction may be $L_g$, and a distance between the gate electrodes 560, that is, a length of the isolating layer 570 in the Z direction, may be $L_d$. According to this structure, as described with respect to the corresponding structure illustrated in FIG. 1, a distance between adjacent cells and a length of a switching area formed in the recording material layer 530 may be set differently from the distances $L_g$ and $L_d$.

The gate electrodes 560 may include a metal material, or a silicon material doped in a high concentration. Each gate electrode 560 may be connected to either of a word line WL and a string selection line SSL.

The isolating layer 570 may include various insulating materials, such as silicon oxide, silicon nitride, etc.

In a direction from a surface on which the gate electrode 560 and the isolating layer 570 contact the gate insulating layer 550, the gate electrode 560 may be recessed from the isolating layer 570 by the length $D_r$.

A process of manufacturing the cell strings CS described above may be performed in an order from an external structure to an inner structure. That is, the structure in which the gate electrodes 560 and the isolating layers 570 are alternately stacked may be formed first, wherein each of the gate electrodes 560 and the isolating layers 570 has a cylindrical shell shape having the same external diameter as each other and different inner diameters from each other by the length $D_r$. Then, the gate insulating layer 550, the channel layer 540, the recording material layer 530 may be sequentially conformally deposited on an inner surface thereof. This aspect will be described below with respect to a method of manufacturing a memory device.

An end of the channel layer 540 and the recording material layer 530 may contact the doped area 525, that is, a common source area.

A drain area 580 may be provided at the other end of the channel layer 540 and the recording material layer 530. The drain area 580 may include a second-type doped silicon material. For example, the drain area 580 may include a silicon material doped with an n-type material.

A bit line 590 may be provided on the drain area 580. The drain area 580 and the bit line 590 may be connected to each other via contact plugs.

Each gate electrode 560, and areas of the gate insulating layer 550, the channel layer 540, and the recording material layer 530 facing the gate electrode 560 may form a memory cell MC. That is, the memory cell MC may have a circuit structure in which a transistor including the gate electrode 560, the gate insulating layer 550, and the channel layer 540 is connected in parallel with a variable resistance due to the recording material layer 530.

The parallel connection structure may be continually arranged in the vertical direction (the Z direction) and may form the cell string CS. Also, both ends of the cell string CS may be connected to the common source line CSL and the bit line BL as illustrated in the circuit diagram of FIG. 9. By applying a voltage to the common source line CSL and the bit line BL, programming (writing), reading, and erasing may be performed on the plurality of memory cells MC.

For example, when a memory cell MC on which a programming operation is to be performed is selected, a gate voltage value of the corresponding cell may be adjusted so a channel is not formed in the selected cell. In other words, for a selected cell in a programming operation, a gate voltage value of the corresponding cell may be adjusted so the cell is in a channel-off state. A gate voltage value of the non-selected cells may be adjusted so the non-selected cells are in a channel-on state. Accordingly, a current path due to the voltage applied to the common source line CSL and the bit line BL may pass through an area of the recording material layer 530 of the selected memory cell MC. Here, the applied voltage may be set as $V_{set}$ or $V_{reset}$ to make an LRS or an HRS, and data of 1 or 0 as desired may be written in the selected memory cell MC.

A reading operation may be similarly performed on the selected cell. That is, a gate voltage applied to each gate electrode 560 may be adjusted such that a selected memory cell MC is in a channel-off state and non-selected memory cells MC are in a channel-on state. Then, currents, flowing through the corresponding cells MC due to the applied voltage $V_{read}$ between the common source line CSL and the bit line BL, may be measured to identify a cell state (1 or 0).

In this VNAND structure, due to a packaging limit according to a height of the cell string CS, there is a limit to increase the number of gate electrodes 560 included in the cell string CS. In particular, there is a limit to decrease the distance $L_d$ between adjacent gate electrodes 560 due to interference between adjacent cells. Thus, a memory capacitance may have a limit according to a limit value for reducing a sum $L_s$ of vertical lengths of the gate electrodes 560 adjacent in the vertical direction (the Z direction) and the isolating layer 570.

As described above, the memory device 500 according to an embodiment may be realized by forming the memory cells MC and arraying the memory cells MC, wherein the memory cells MC include the channel layer 540 and the recording material layer 530 having a recessed gate structure (or a protruding insulating structure) for forming a current path allowing a stable switching behavior. Thus, compared to a structure in which a channel layer and a recording material layer are formed in a constant direction, the distance $L_d$ between the gate electrodes 560 may be reduced, and the electrical distance between the cells may be increased. Also, the length of the switching area may be less than the length $L_g$ of the gate electrode 560. Based on this structure, the sum $L_s$ of the lengths of the gate electrode 560 and the isolating layer 570 in the vertical direction (the Z direction) may be minimized, and accordingly density of the memory cell increases and an operation voltage is reduced.

As described above, the memory device 500 according to an embodiment may address a scaling issue between memory cells in next-generation VNAND memories, and thus, the density may be increased and low power consumption may be realized.

Figure 22:
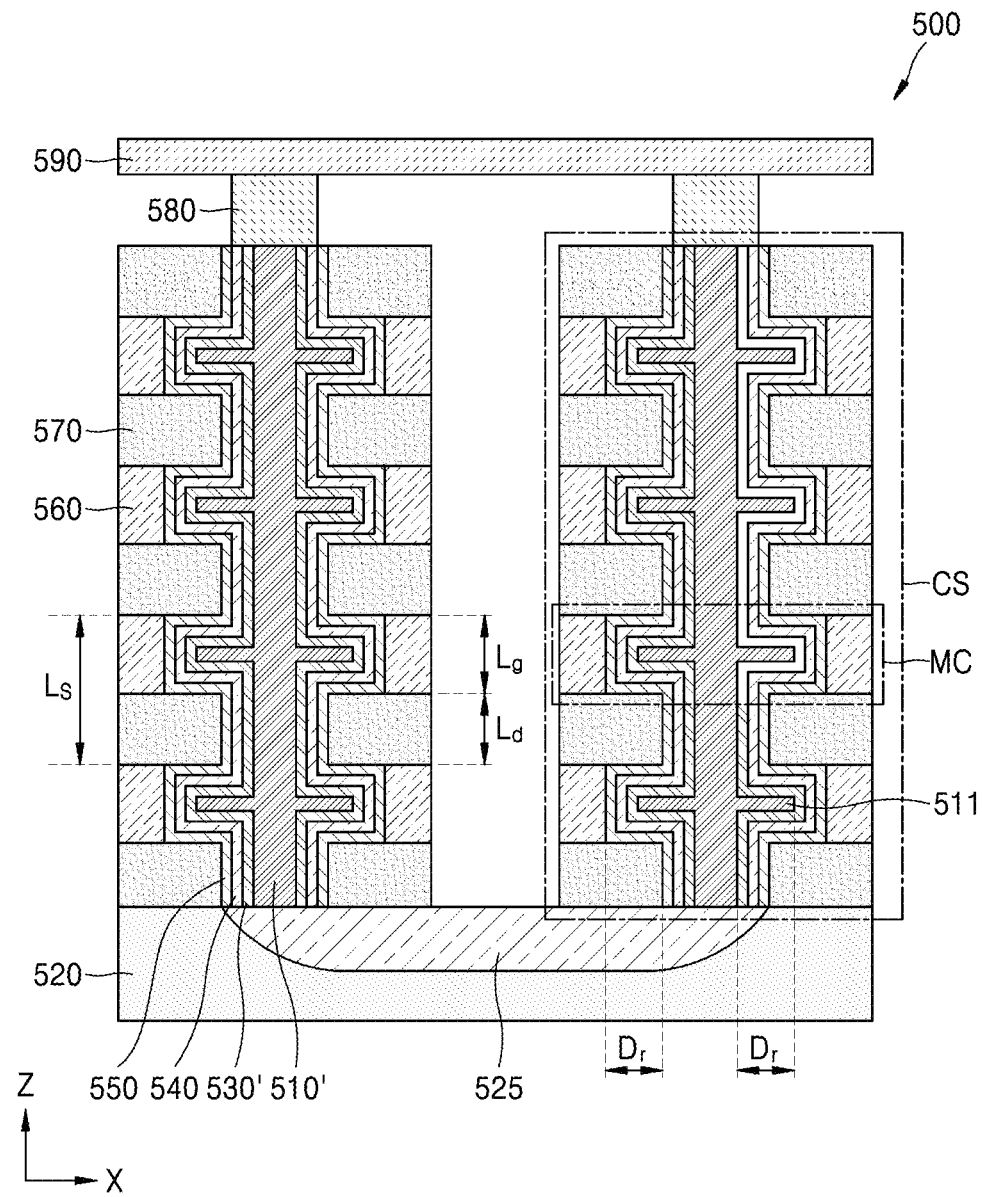
FIG. 22 is a schematic cross-sectional view of a memory device according to another embodiment.

The memory device 500 may be modified in various ways. For example, as depicted in FIG. 22, the memory device 500 may be modified so the bottom surface of the insulating structure 510' directly contacts the doped area 525 and the recording material layer 530' has a different shape. The recording material layer 530' may define an opening that allows the insulating structure 510' to pass through a bottom of the recording material layer 530', thereby making it possible for the insulating structure 510' to directly contact the doped area 525.

FIGS. 10A through 19B are views for describing a method of manufacturing a memory device, according to an embodiment.

Figure 10A:
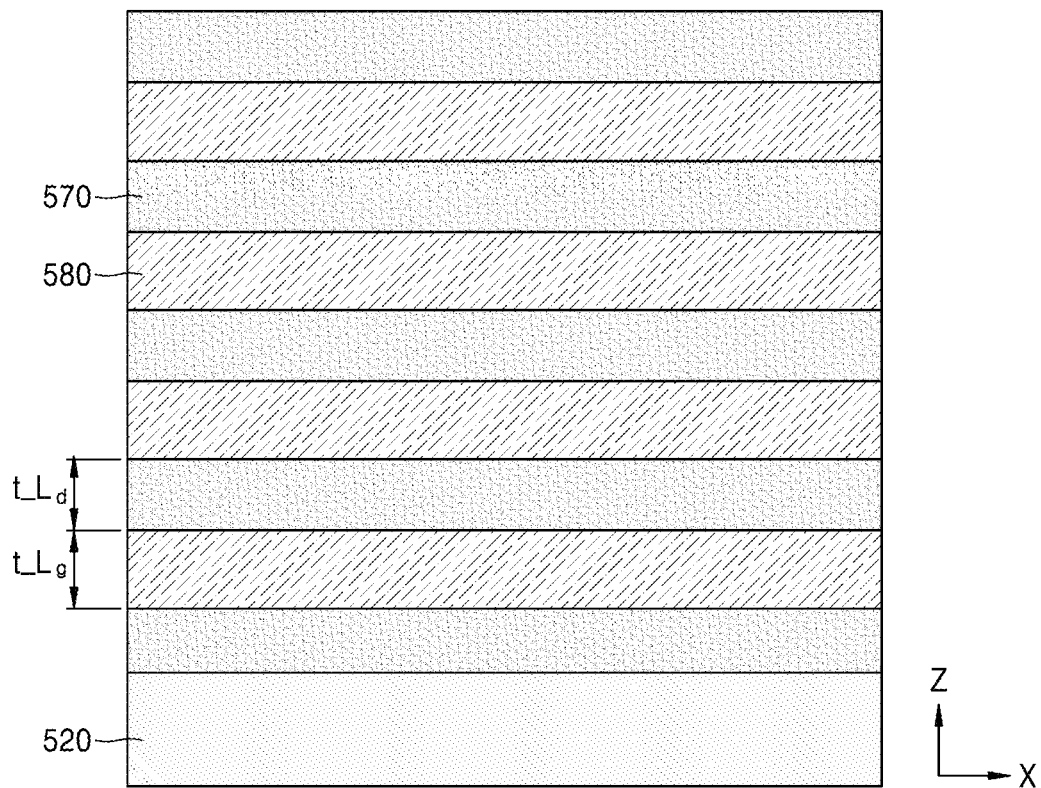
FIGS. 10A through 19B are views for describing a method of manufacturing a memory device, according to an embodiment.
Figure 10B:
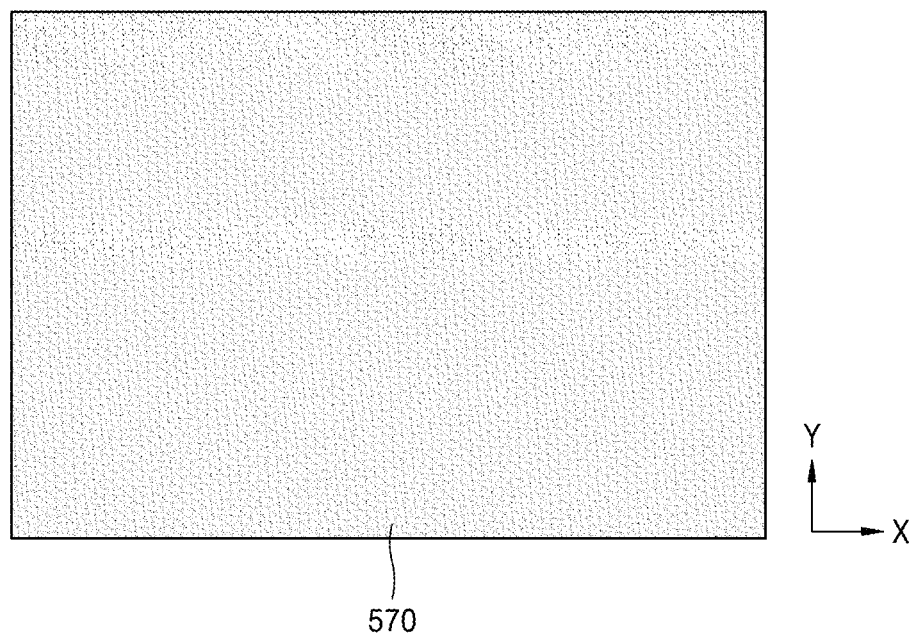

FIGS. 10A and 10B are a cross-sectional view and a plan view, respectively. First, a stack structure in which the isolating layer 570 and a sacrificial layer 580 are repeatedly alternately stacked may be formed on the substrate 520.

The substrate 520 may include a silicon substrate. For example, the substrate 520 may include a silicon substrate doped with a certain impurity. The substrate 520 may include a p-type silicon substrate. However, the substrate 520 is not limited thereto.

The isolating layer 570 may include an insulating material. For example, the isolating layer 570 may include $SiO_2$.

The sacrificial layer 580 may be formed to form a recess structure for forming a channel layer and a recording material layer having a curved path. The sacrificial layer 580 may include a material having an etch rate that is different from an etch rate of a material of the isolating layer 570. The isolating layer 570 may include, for example, $SiN_x$.

A thickness $t\_L_d$ of the isolating layer 570 and a thickness $t\_L_g$ of the sacrificial layer 580 may be determined according to a detailed structure of a memory device to be manufactured. The thickness $t\_L_d$ of the isolating layer 570 and the thickness $t\_L_g$ of the sacrificial layer 580 may respectively correspond to a distance between gate electrodes and a length $L_g$ of the gate electrodes of the memory device to be manufactured. The thickness $t\_L_d$ of the sacrificial layer 580 may be within a range of about 5 nm to about 30 nm. The thickness $t\_L_d$ of the isolating layer 570 may be within a range of about 5 nm to about 30 nm.

The gate electrode may be formed on a location of the sacrificial layer 580. That is, the number of sacrificial layers 580 may correspond to the number of unit cells of the memory device to be manufactured.

To form the isolating layer 570 and the sacrificial layer 580, deposition methods, such as atomic layer deposition (ALD), metal organic ALD (MOALD), chemical vapor deposition (CVD), metal organic CVD (MOCVD), physical vapor deposition (PVD), etc., may be used. These deposition methods may include locating the substrate 520 in a chamber, heating the chamber by a certain temperature and supplying a source to the chamber. Here, process conditions, such as a temperature and a duration time, may be adjusted according to a desired thickness.

Figure 11A:
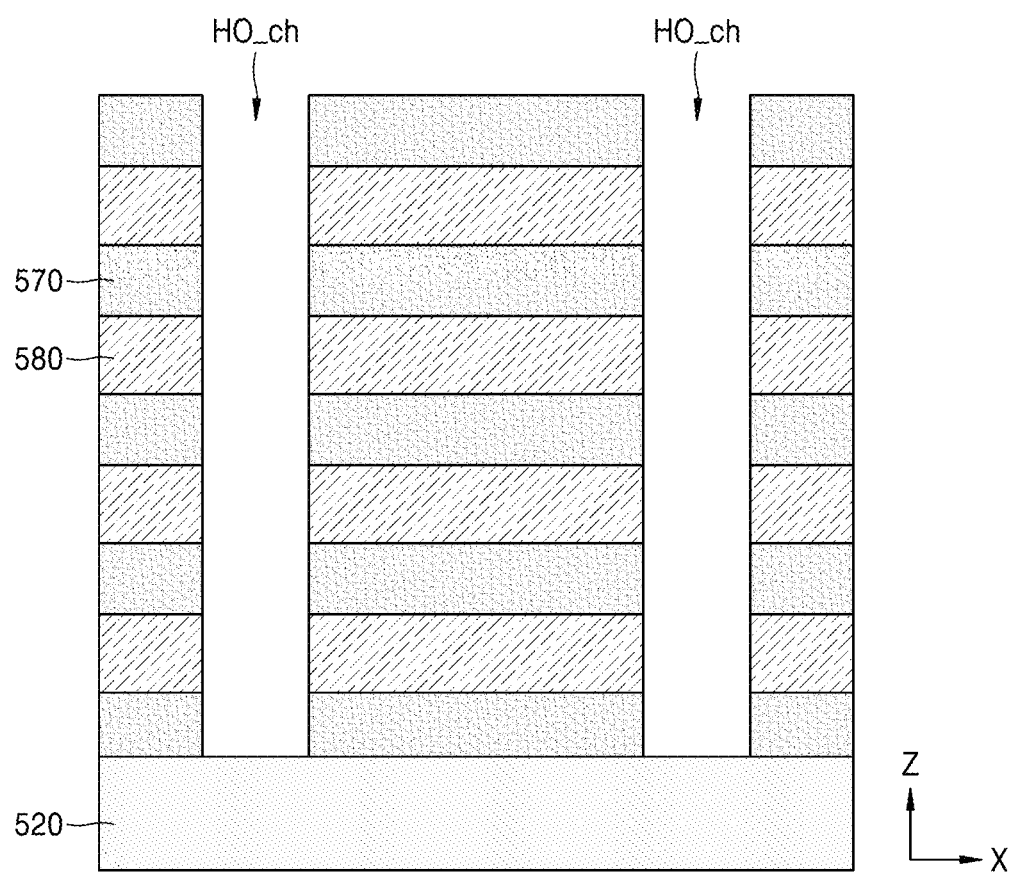
Figure 11B:
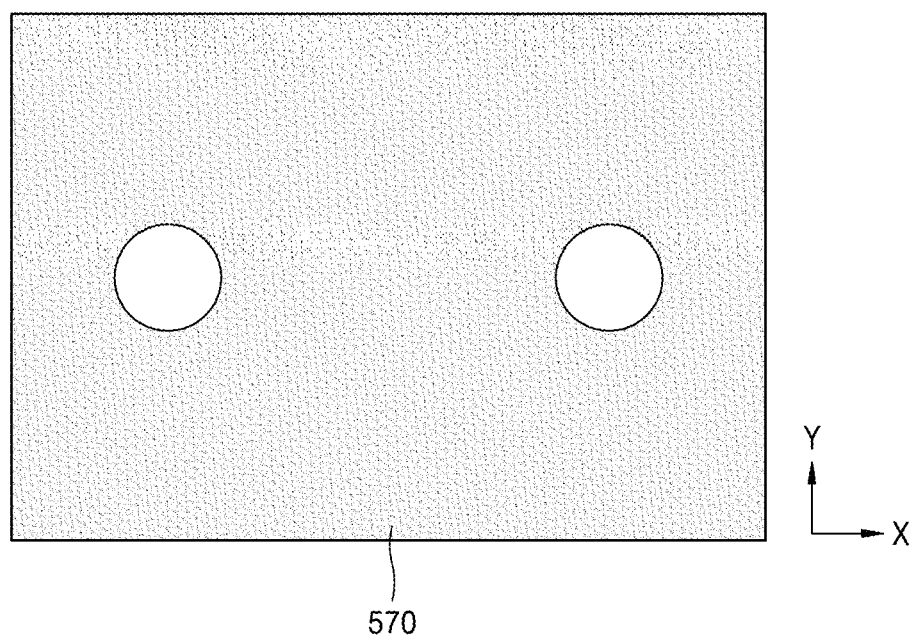

FIGS. 11A and 11B are respectively a cross-sectional view and a plan view. A channel hole HO_ch may be formed in the stack structure formed in FIGS. 10A and 10B. The channel hole HO_ch may be configured to apply a channel material and a recording material to a gate recess structure, after the gate recess structure is formed on the sacrificial layer 580. A photolithography process and an etching process may be used to form the channel hole HO_ch. It is illustrated that the number of channel holes HO_ch is two. However, it is only an example. For example, the channel holes HO_ch may be formed in a number corresponding to the number of cell strings CS described in FIGS. 7 through 9.

Figure 12A:
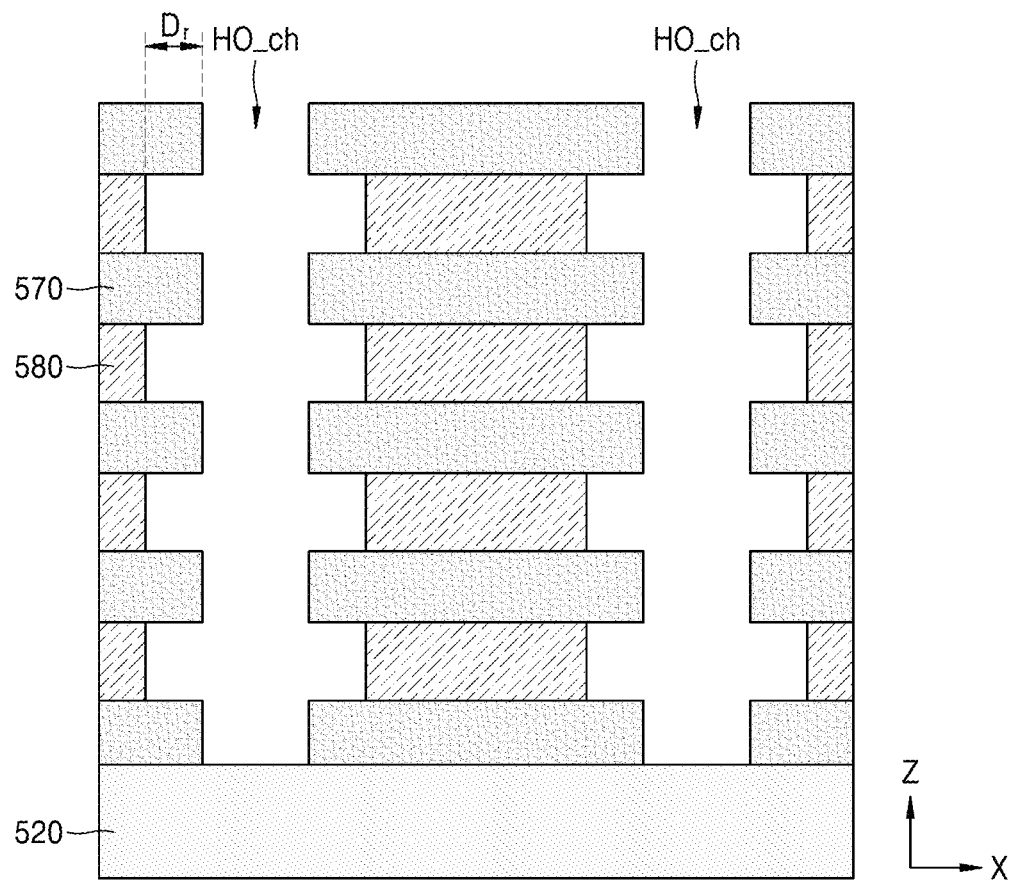
Figure 12B:
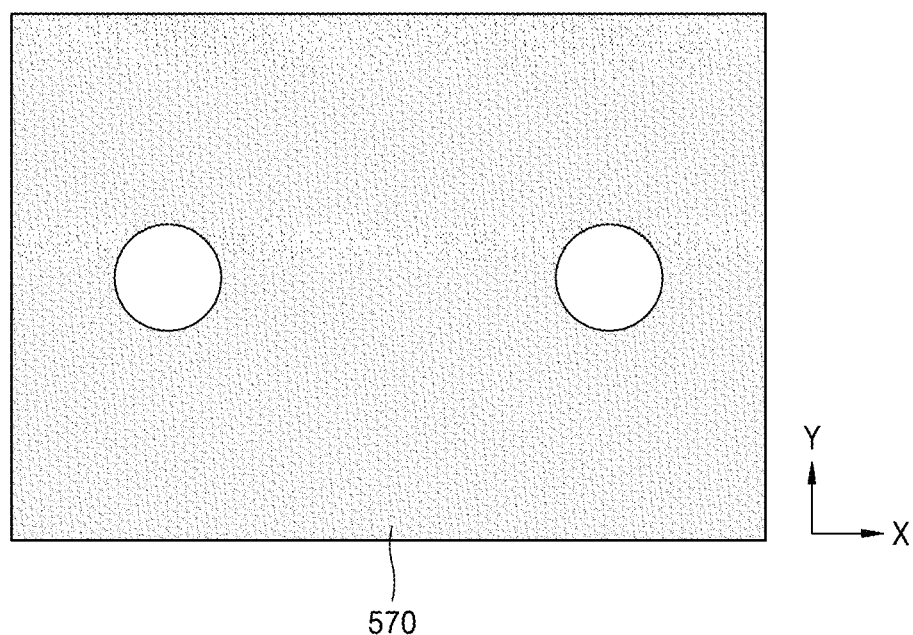

Next, referring to FIGS. 12A and 12B, the sacrificial layer 580 may be partially etched to allow an inner surface of the channel hole HO_ch to have a concavo-convex shape. To selectively etch the sacrificial layer 580 from the sacrificial layer 580 and the isolating layer 570 having different etch rates from each other, wet etching, which uses an etch solution etching the sacrificial layer 580 and not etching the isolating layer 570, may be used. Alternatively, an etch solution etching the sacrificial layer 580 and the isolating layer 570 by different rates may be used. However, the disclosure is not limited thereto. An etch solution and an etch duration time may be set such that a length of the concavo-convex shape, that is, a length in which the sacrificial layer 580 is recessed from the isolating layer 570 in a first direction (an X direction) perpendicular to a stack direction (a Z direction), corresponds to a length $D_r$. The length $D_r$ may be, for example, equal to or greater than about 5 nm. The length $D_r$ may be within the range of about 1 nm to about 30 nm.

Figure 13A:
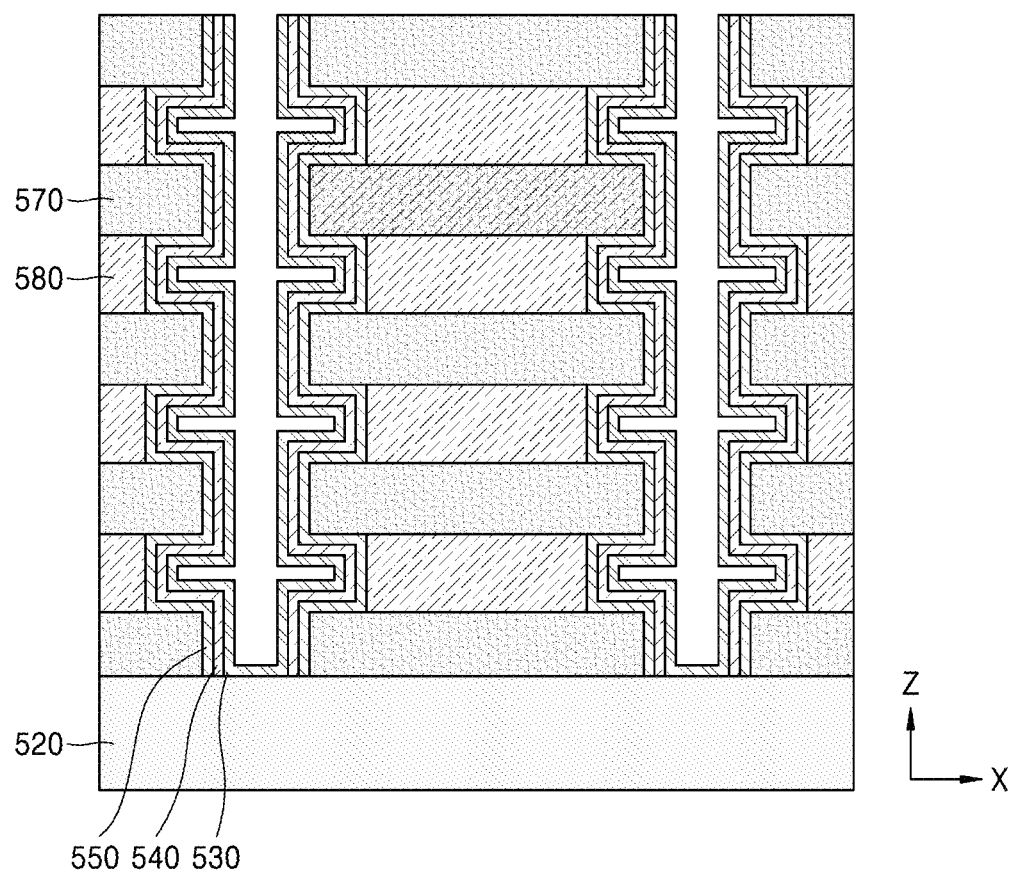
Figure 13B:
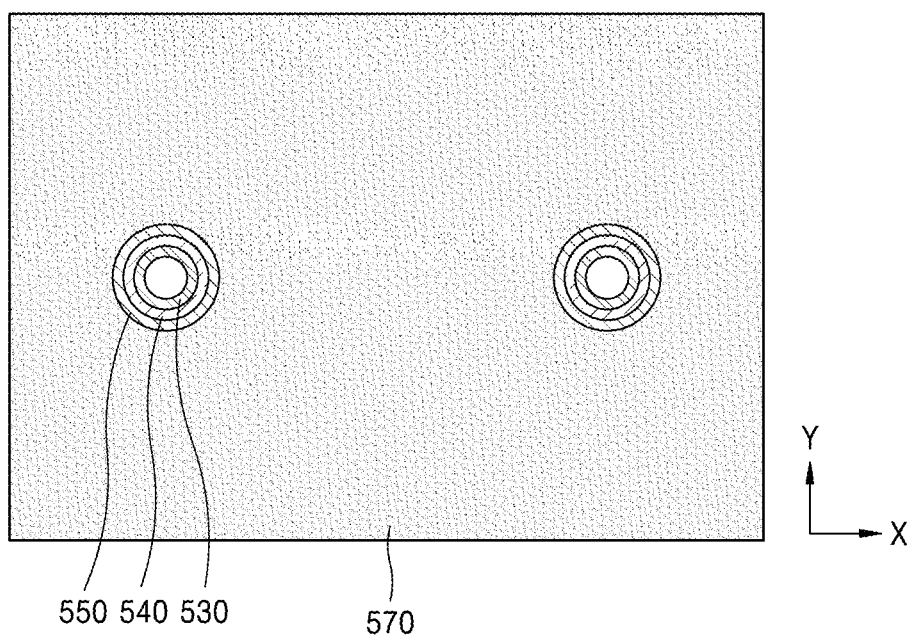

Next, referring to FIGS. 13A and 13B, the gate insulating layer 550, the channel layer 540, and the recording material layer 530 may be sequentially formed on the inner surface of the channel hole HO_ch.

The gate insulating layer 550 may include various insulating materials, such as silicon oxide, silicon nitride, or silicon oxynitride. The channel layer 540 may include a semiconductor material and may include, for example, poly-silicon. The channel layer 540 may be doped with a desired (and/or alternatively predetermined) dopant and may be doped with a p-type material, like the substrate 520. However, the channel layer 540 is not limited thereto. The channel layer 540 may include, for example, materials, such as Ge, IGZO, GaAs, etc. The recording material layer 530 may include a variable resistance material or a phase-change material. The variable resistance material may include any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$. The phase-change material may include GST ($Ge_2SbTe_5$).

To form the layers, deposition methods, such as ALD, MOALD, CVD, MOCVD, PVD, etc. may be used. The deposition methods may include locating the stack structure in which the channel hole HO_ch is formed in a chamber, heating the chamber by a certain temperature and supplying a source to the chamber. Here, according to a desired thickness of each layer, process conditions, such as a temperature, a duration time, etc., may be adjusted.

The gate insulating layer 550 and the channel layer 540 may be formed in the inner surface of the channel hole HO_ch. Then, before forming the recording material layer 530, an insulating material and a channel material deposited on a bottom surface of the channel hole HO_ch may be removed.

Figure 14A:
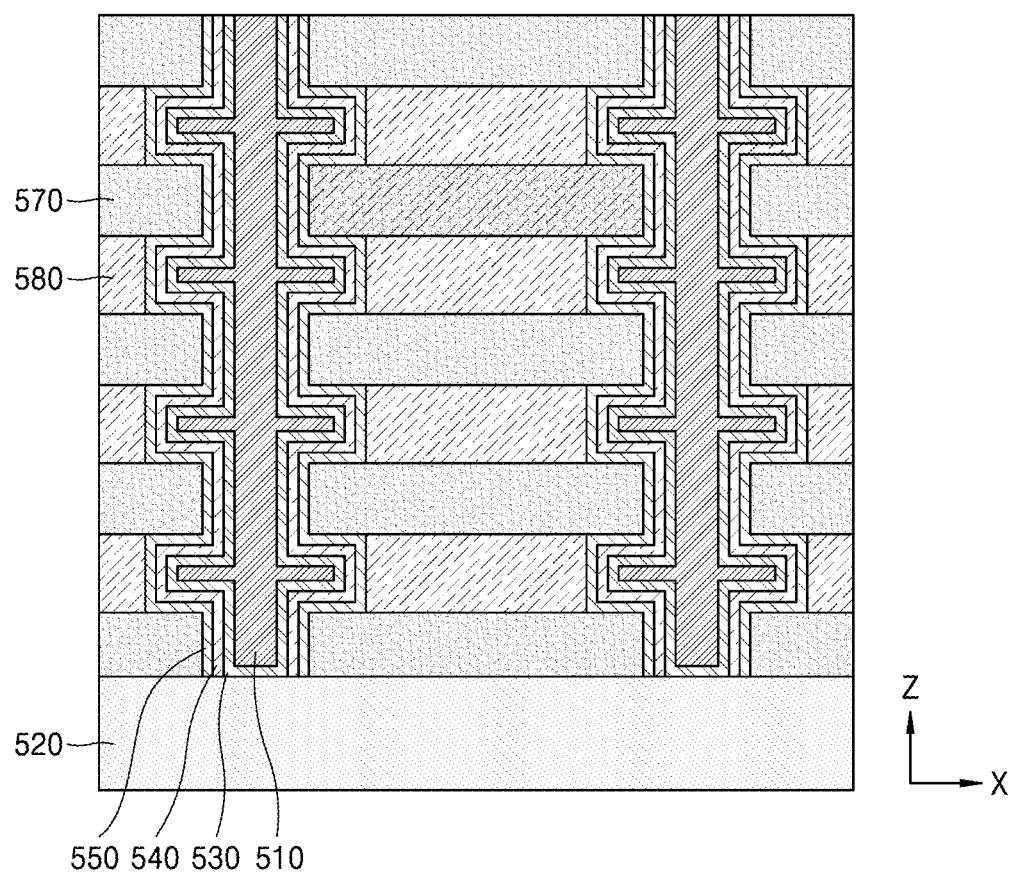
Figure 14B:
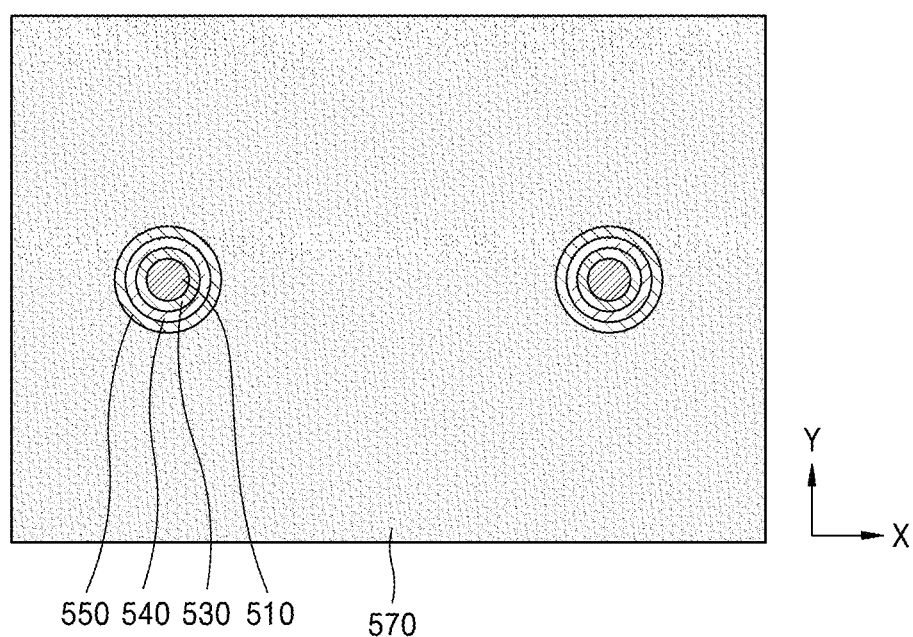

Next, the insulating structure 510 may be formed in a remaining space of the inner surface of the channel hole HO_ch, as illustrated in FIGS. 14A and 14B. In some embodiments, the operations of FIGS. 13A, 13B, 14A, and 14B may be modified to anisoptropically etch the recording material layer 530 before forming the insulating structure 510 to provide the recording material layer 530' illustrated in FIG. 22; in which case, the insulating structure 510' may be formed afterwards.

Figure 15A:
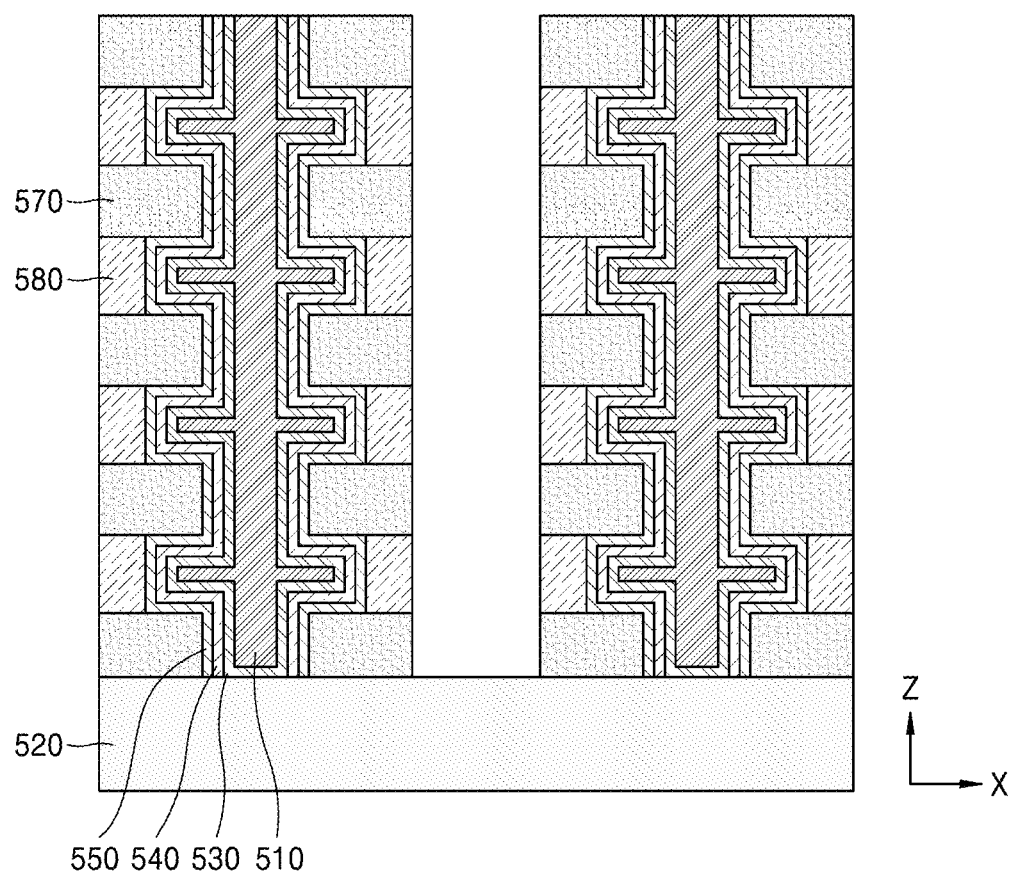
Figure 15B:
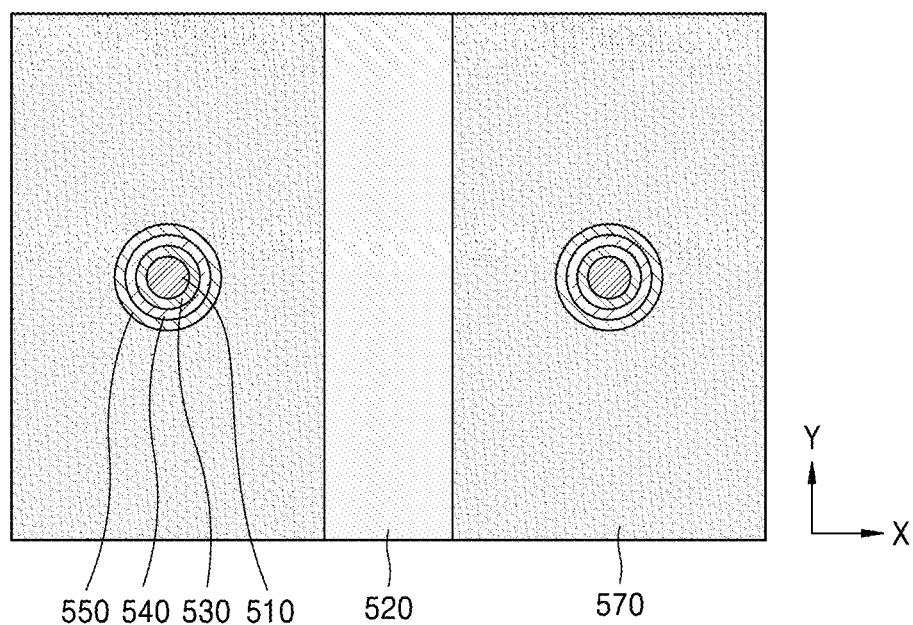

Next, a structure of FIG. 14A may be etched and cut as illustrated in FIGS. 15A and 15B.

Figure 16A:
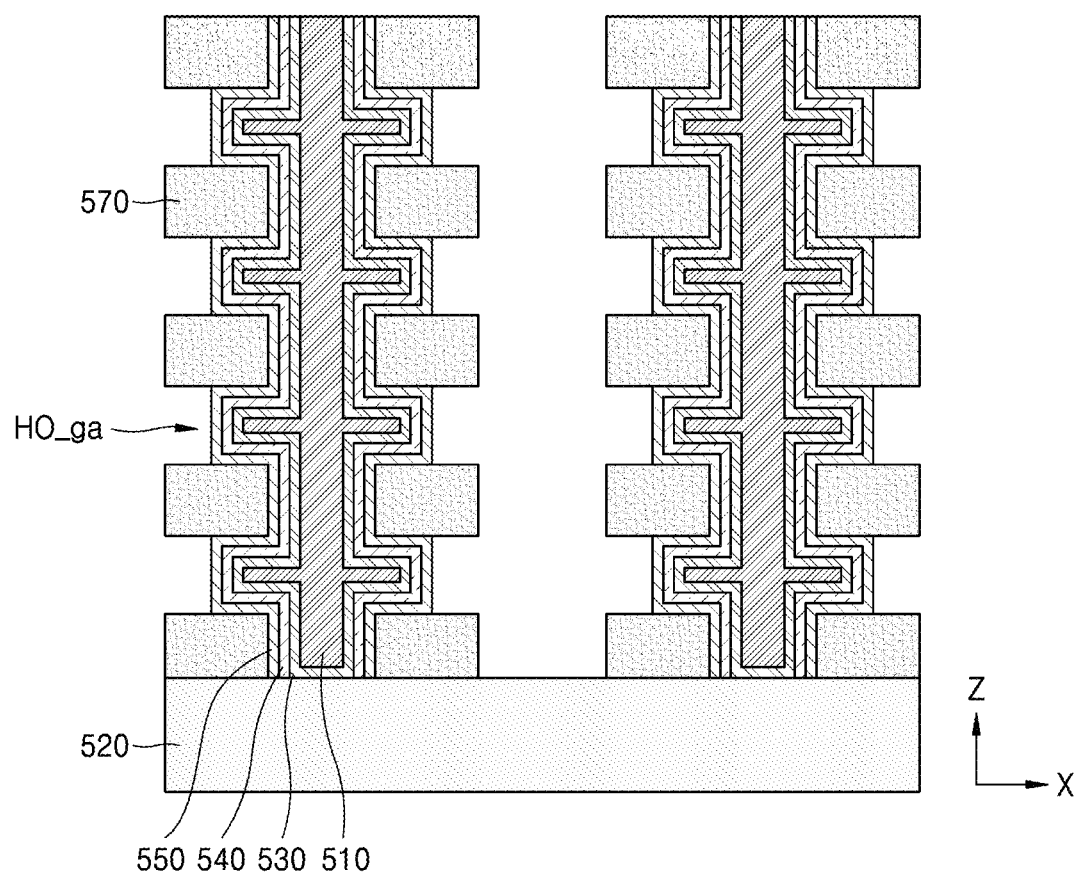
Figure 16B:
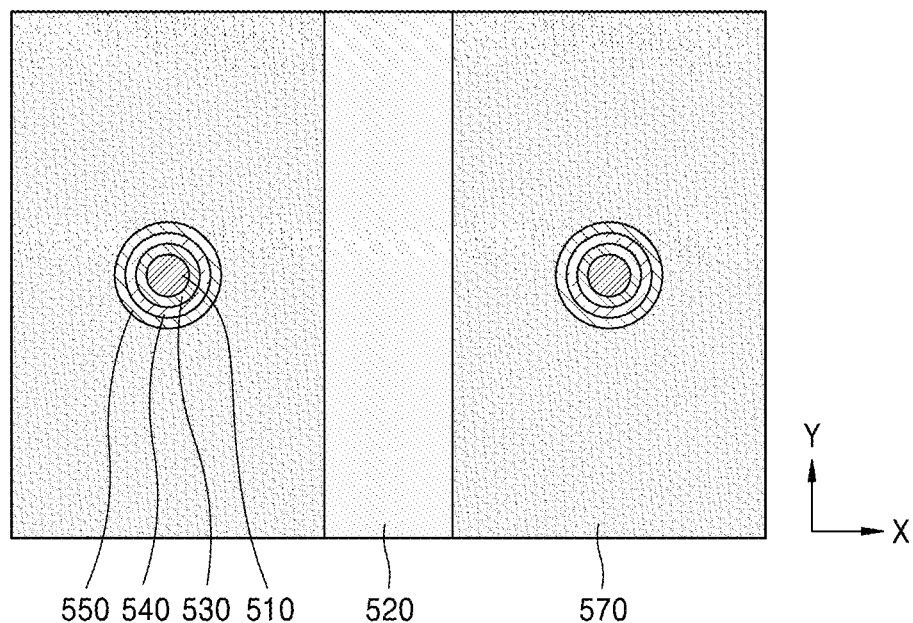
Figure 17A:
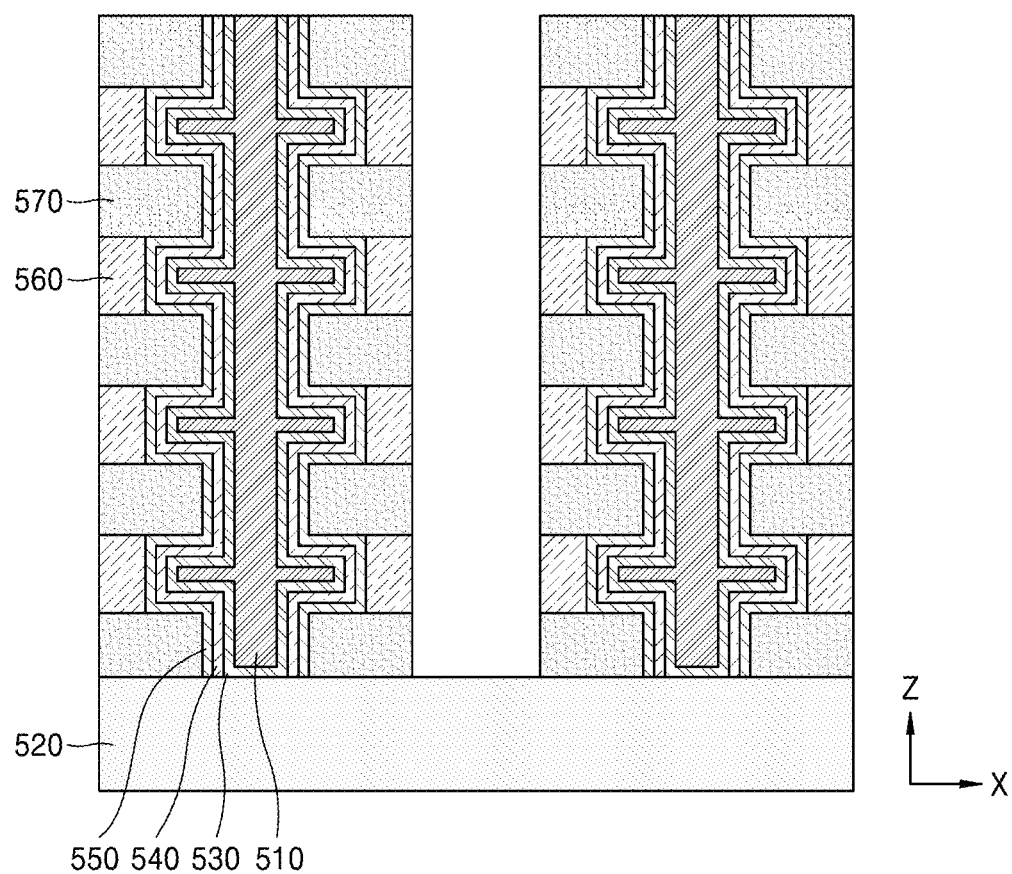
Figure 17B:
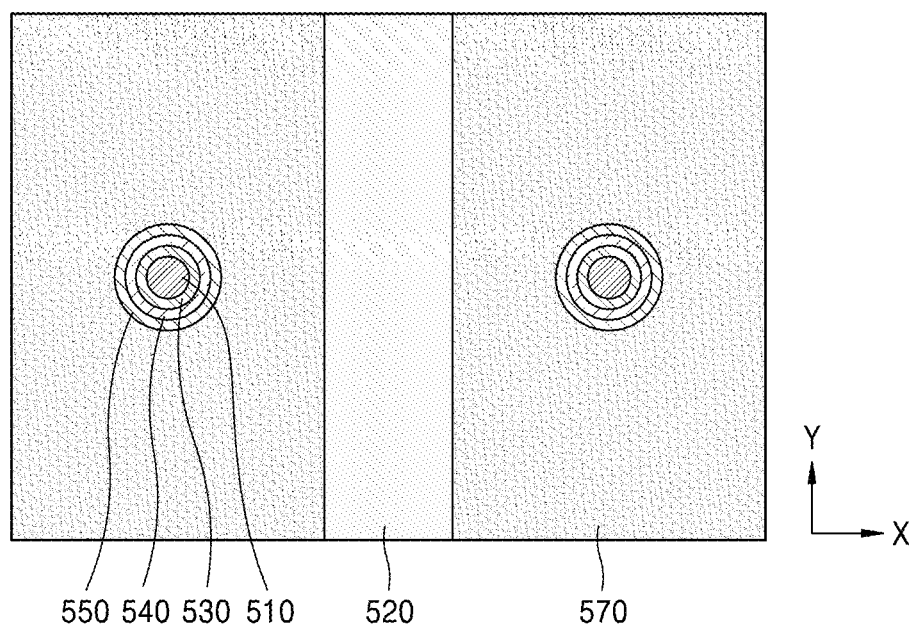

Thereafter, by removing the remaining sacrificial layer 580, a gate hole HO_ga may be formed as illustrated in FIGS. 16A and 16B. Then, by depositing an electrode material in the gate hole HO_ga, the gate electrode 560 may be formed as illustrated in FIG. 17A. Then, two cell strings CS may be formed on the substrate 520.

Figure 18A:
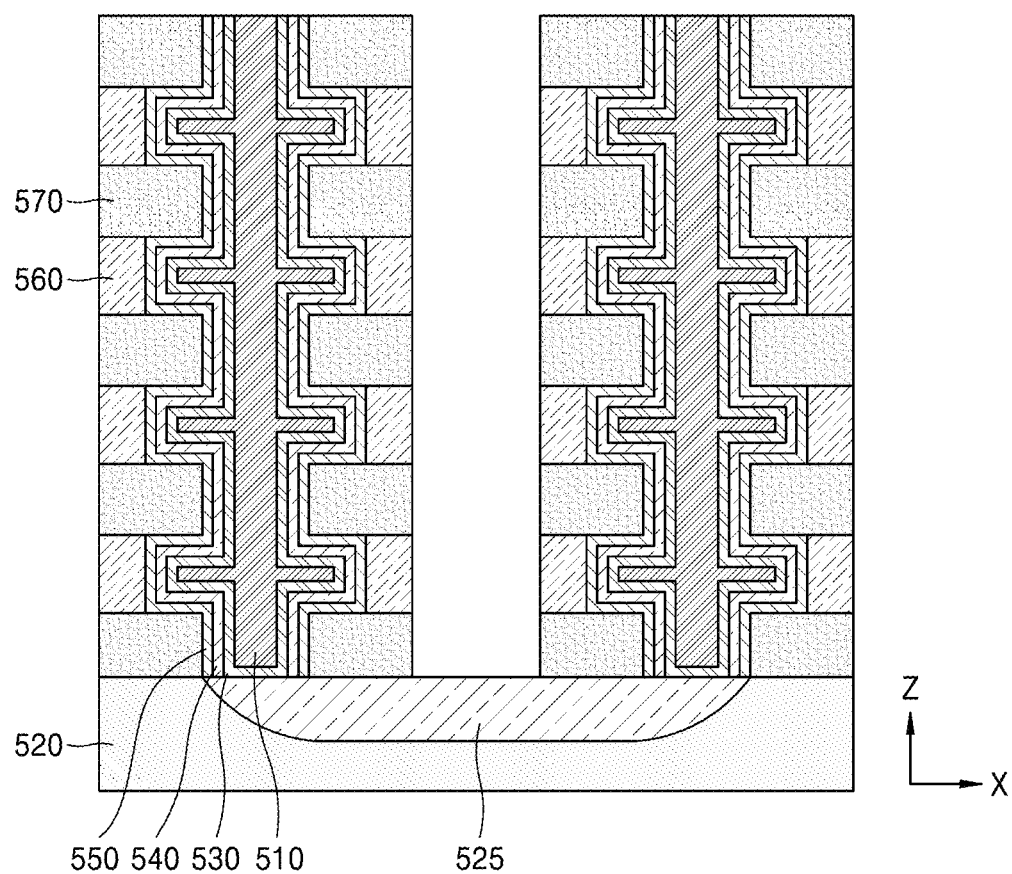
Figure 18B:
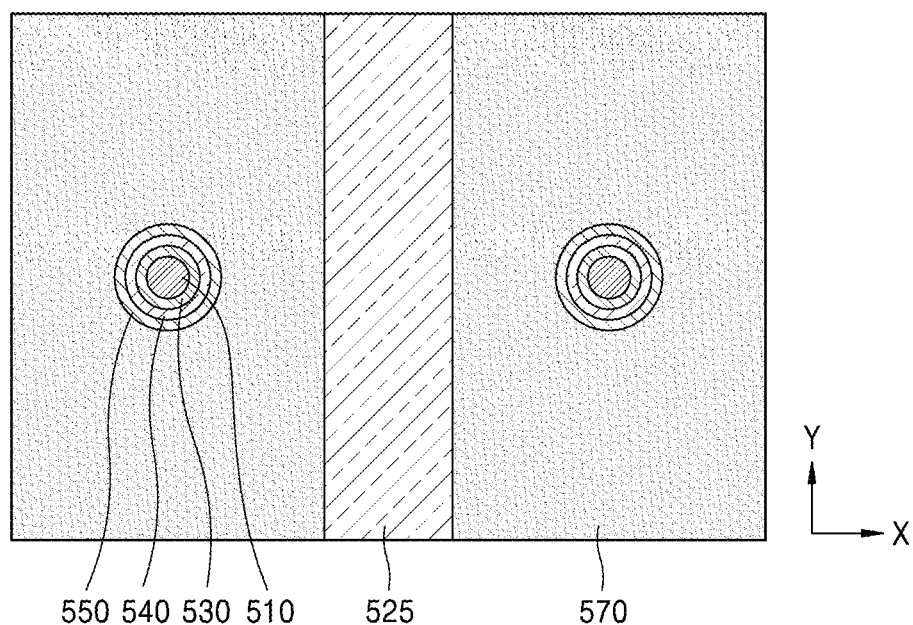

Next, as illustrated in FIGS. 18A and 18B, the common source area 525 may be formed. The above process may correspond to a process in which a dopant may be applied onto a certain area of the substrate 510 so as to form the area as a highly concentrated area. The common source area 525 may be formed to contact the channel layer 540 and the recording material layer 530 at an end of the two string cells CS.

Figure 19A:
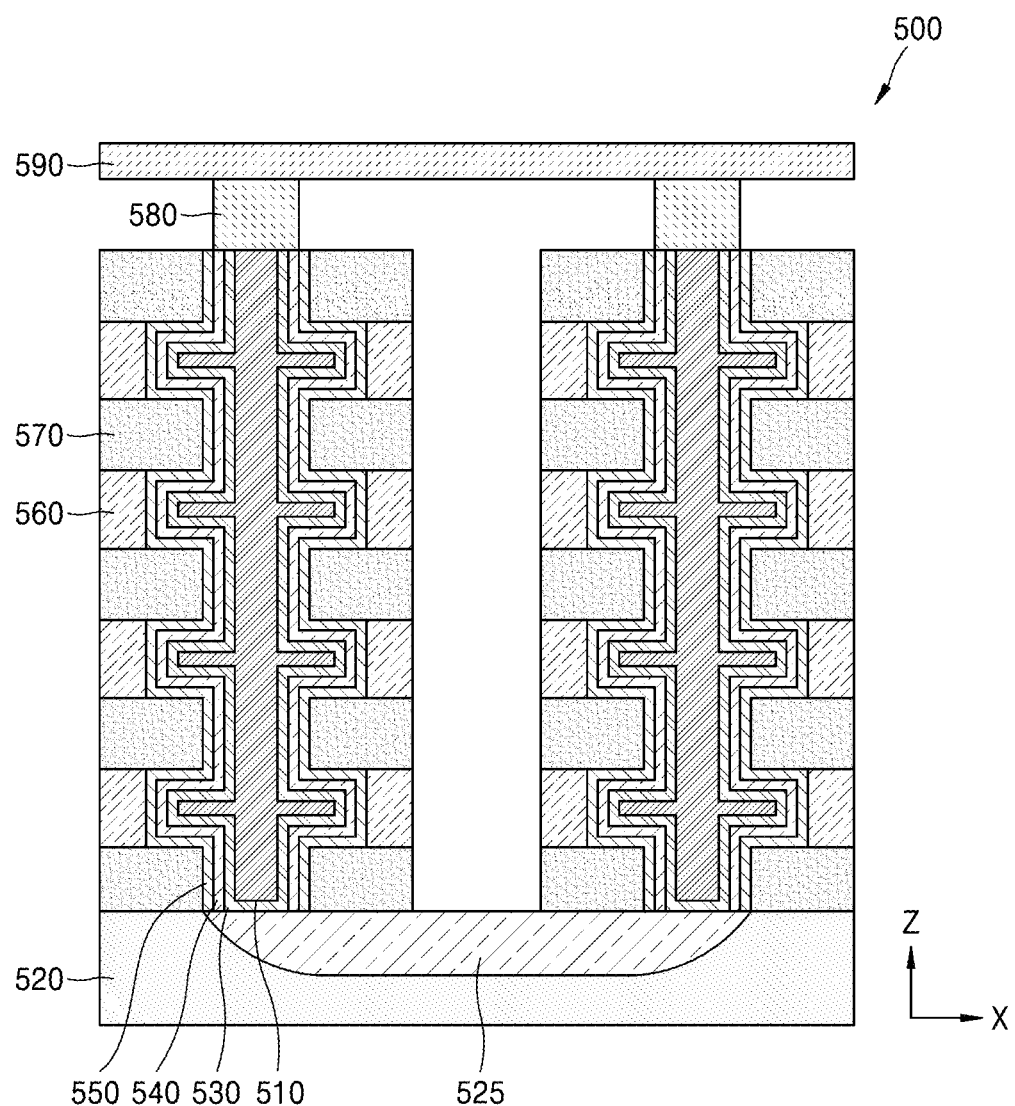
Figure 19B:
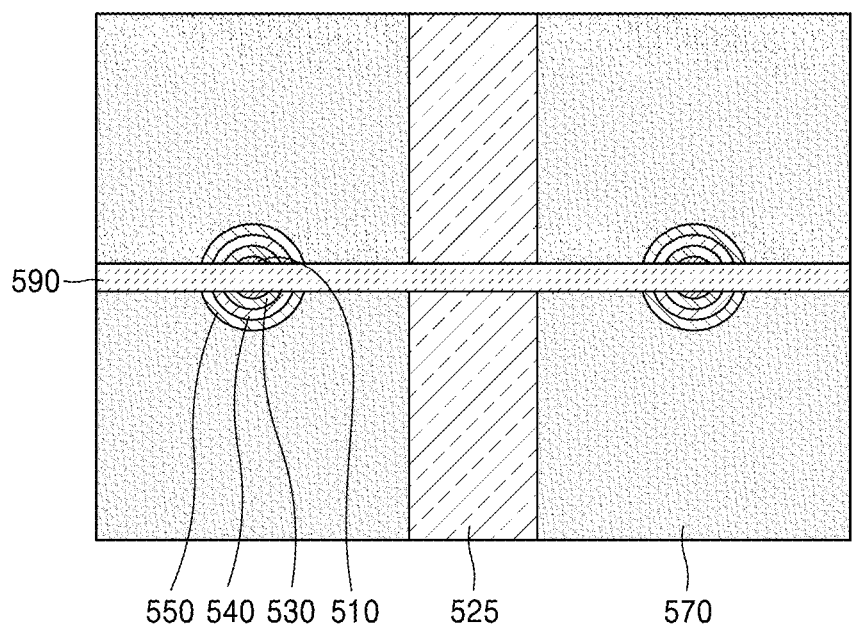

Next, as illustrated in FIGS. 19A and 19B, the drain area 580 may be formed, the drain area 580 being connected to the other end of the two string cells CS, that is, an end opposite to the end at which the channel layer 540 and the recording material layer 530 are connected to the common source area 525. Also, the bit line 590 for connecting the drain area 580 may be formed.

The memory devices 200 and 500 according to the disclosure may be implemented as a memory system of various electronic devices. The memory device 500 may be realized as a memory block in the form of a chip and may be used as a neuromorphic computing platform or may be used to form a neural network.

Figure 20:
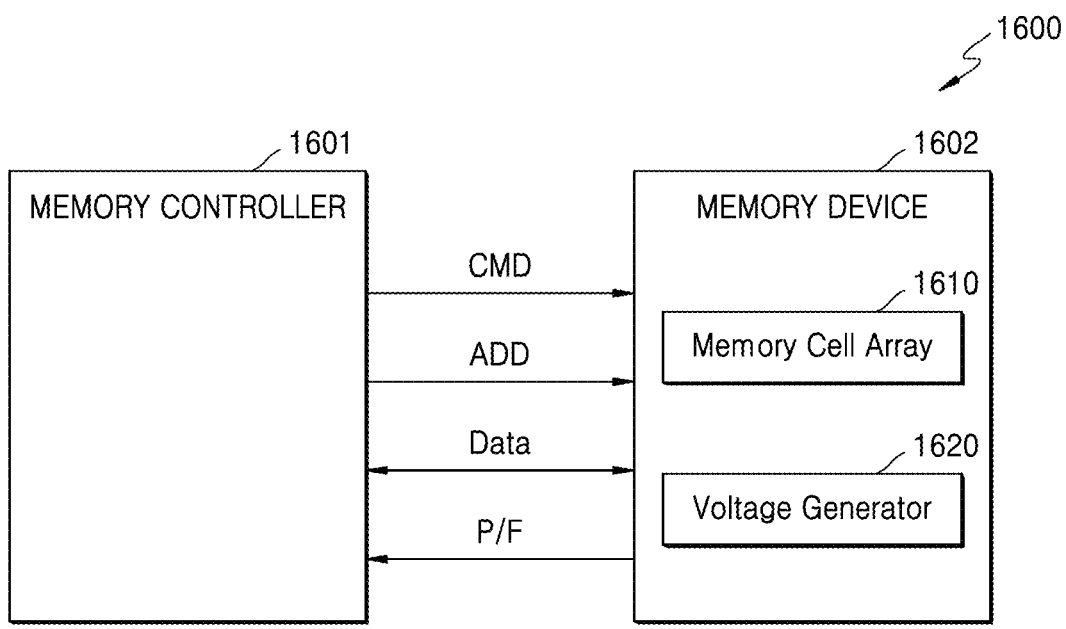
FIG. 20 is a block diagram of a memory system according to an embodiment.

FIG. 20 is a block diagram of a memory system 1600 according to an embodiment.

Referring to FIG. 20, the memory system 1600 may include a memory controller 1601 and a memory device 1602. The memory controller 1601 may be configured to perform a control operation with respect to the memory device 1602. For example, the memory controller 1601 may provide, to the memory device 1602, an address ADD, or a command CMD for performing programming (or writing), reading, and/or erasing on the memory device 1602. Also, data for the programming and the reading may be transmitted between the memory controller 1601 and the memory device 1602.

The memory device 1602 may include a memory cell array 1610 and a voltage generator 1620, such as a voltage generation circuit, which may include circuit elements (e.g., capacitor, battery, power device) for setting a voltage of the voltage generator 1620. The memory cell array 1610 may include a plurality of memory cells arranged at a region where a plurality of word lines and a plurality of bit lines intersect. The memory cell array 1610 may include one or more of the memory devices 200 and 500 according to the embodiments of FIGS. 1 and 7.

The memory controller 1601 may include: a processing circuit, such as hardware including a logic circuit; a hardware/software combination, such as a processor executing software; or a combination thereof. More specifically, the processing circuit may include, for example, a central processing unit (CPU), an arithmetic logic unit (ALU), a digital signal processor, a micro-computer, a field programmable gate array (FPGA), a system-on-chip (SoC), a programmable logic unit, a microprocessor, an application-specific integrated circuit (ASIC), etc. However, it is not limited thereto. The memory controller 1601 may operate in response to a request from a host (not shown). The memory controller 1601 may be configured to access the memory device 1602 and control the control operations (for example, writing/reading operations) described above, to convert the memory controller 1601 into a specific purpose controller. The memory controller 1601 may generate an address ADD and a command CMD for performing programming/reading/erasing operations on the memory cell array 1610. Also, in response to the command CMD from the memory controller 1601, the voltage generator 1620 (for example, a power circuit) may generate a voltage control signal for controlling a voltage level of the word line for data programming or data reading with respect to the memory cell array 1610.

Also, the memory controller 1601 may perform a determination operation on data that is read from the nonvolatile memory device 1602. For example, the number of on-cells and/or the number of off-cells may be determined from the data DATA read from a memory cell. The memory device 1602 may provide a pass/fail (P/F) signal to the memory controller 1601 according to a result of the determination respect to the read data. The memory controller 1601 may control a writing operation and a reading operation on the memory cell array 1610 by referring to the P/F signal.

Figure 21:
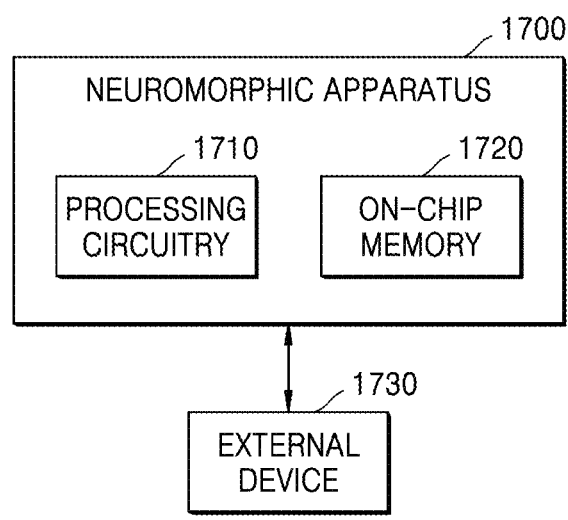
FIG. 21 is a block diagram of a neuromorphic apparatus and an external device connected to the neuromorphic apparatus, according to an embodiment.

FIG. 21 is a block diagram of a neuromorphic apparatus and an external device connected thereto, according to an embodiment.

Referring to FIG. 21, the neuromorphic apparatus 1700 may include a processing circuitry 1710 and/or an on-chip memory 1720. The neuromorphic apparatus 1700 may include one or more of the memory devices 200 and 500 according to the embodiments of FIGS. 1 and 7.

In some embodiments, the processing circuitry 1710 may be configured to control functions to drive the neuromorphic apparatus 1700. For example, the processing circuitry 1710 may be configured to control the neuromorphic apparatus 1700 by executing programs stored in the on-chip memory 1720. In some embodiments, the processing circuitry 1710 may include hardware, such as a logic circuit, a hardware/software combination, such as a processor executing software, or a combination thereof. For example, the processor may include a CPU, a graphics processing unit (GPU), an application processor (AP) included in the neuromorphic apparatus 1700, an ALU, a digital signal processor, a microcomputer, a FPGA, an SoC, a programmable logic unit, a microprocessor, an ASIC, etc., but is not limited thereto. In some embodiments, the processing circuitry 1710 may be configured to read/write various data with respect to the external device 1730 and/or execute the neuromorphic apparatus 1700 by using the read/written data. In some embodiments, the external device 1730 may include an external memory and/or a sensor array having an image sensor (for example, a CMOS image sensor circuit).

In some embodiments, the neuromorphic apparatus 1700 of FIG. 21 may be applied to a machine learning system. The machine learning system may include various artificial neural network organizations and processing models, such as a convolution neural network (CNN), a repeated neural network (RNN) selectively including a deconvolution neural network, a long short-term memory (LSTM) unit, and/or a gated recurrent unit (GRU), a stacked neural network (SNN), a state-space dynamic neural network (SSDNN), a deep faith network (DBN), a generative adversarial network (GAN), and/or a restricted Boltzmann machine (RBM).

Alternatively, the machine learning system may include other types of machine learning models, for example, linear and/or logistic regression, statistics clustering, Bayesian classification, determination trees, dimensional reduction such as main component analyses, and/or a combination thereof including an ensemble, such as random forests. The machine learning models may be used to provide various services and/or applications. For example, an image classification service, a user authentication service based on biometric information or biometric data, an advanced driver assistance system (ADAS) service, a voice assistance service, an automatic speech recognition (ASR) service, etc. may be executed by an electronic device.

The memory devices 200 and 500 described above may have a stable switching behavior and may be driven with low power consumption.

In the memory devices 200 and 500 described above, the density may be effectively increased, because the electrical distance between the adjacent cells may be greater than the physical distance between the adjacent cells.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a memory device, the method comprising:
    forming a stack structure by repeatedly and alternately depositing a sacrificial layer and an isolating layer on a substrate;
    forming a channel hole penetrating through the stack structure;
    removing a portion of the sacrificial layer such that an inner surface of the channel hole has a concavo-convex shape in a first direction perpendicular to a stack direction of the stack structure;
    sequentially forming a gate insulating layer, a channel layer, and a recording material layer on the inner surface of the channel hole;
    depositing an insulating material in the channel hole;
    forming a gate hole by removing all of a remaining portion of the sacrificial layer; and
    depositing an electrode material in the gate hole.

2. The method of claim 1, further comprising:
    removing an insulating material and a channel material deposited on a bottom surface of the channel hole, wherein
    the removing the insulating material and the channel material is performed after forming the gate insulating layer and the channel layer on the inner surface of the channel hole and before forming the recording material layer on the inner surface of the channel hole.

3. The method of claim 1, wherein a length of the concavo-convex shape in the first direction is greater than or equal to about 5 nm.

4. The method of claim 1, wherein the forming the stack structure includes forming the sacrificial layer to have a thickness within a range of about 5 nm to about 30 nm.

5. The method of claim 1, wherein the forming the stack structure includes forming the isolating layer to have a thickness within a range of about 5 nm to about 30 nm.

* * * * *